(12) United States Patent
Wentzlaff et al.

(10) Patent No.: US 11,043,259 B2
(45) Date of Patent: Jun. 22, 2021

(54) SYSTEM AND METHOD FOR IN-MEMORY COMPUTE

(71) Applicant: The Trustees of Princeton University, Princeton, NJ (US)

(72) Inventors: David Wentzlaff, Princeton Junction, NJ (US); Fei Gao, Princeton, NJ (US); Georgios Tziantzioulis, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

(21) Appl. No.: 16/845,644

(22) Filed: Apr. 10, 2020

(65) Prior Publication Data

US 2020/0327925 A1 Oct. 15, 2020

Related U.S. Application Data

(60) Provisional application No. 62/833,105, filed on Apr. 12, 2019.

(51) Int. Cl.

| G11C 11/40 | (2006.01) |
| G11C 11/4094 | (2006.01) |
| G11C 29/00 | (2006.01) |
| G11C 11/4091 | (2006.01) |
| G11C 11/4076 | (2006.01) |
| H03K 19/21 | (2006.01) |
| H03K 19/23 | (2006.01) |
| G11C 11/408 | (2006.01) |
| H03K 19/20 | (2006.01) |

(52) U.S. Cl.
CPC ...... *G11C 11/4094* (2013.01); *G11C 11/4076* (2013.01); *G11C 11/4085* (2013.01); *G11C 11/4091* (2013.01); *G11C 29/88* (2013.01); *H03K 19/20* (2013.01); *H03K 19/21* (2013.01); *H03K 19/23* (2013.01)

(58) Field of Classification Search
None
See application file for complete search history.

(56) References Cited

U.S. PATENT DOCUMENTS

| 8,238,173 B2 | 8/2012 | Akerib et al. | |
| 10,049,721 B1 | 8/2018 | Lea et al. | |
| 2012/0176853 A1* | 7/2012 | Kim | G11C 11/40611 365/222 |
| 2015/0371717 A1* | 12/2015 | Park | G11C 29/50008 365/201 |

(Continued)

OTHER PUBLICATIONS

P. Ranganathan, "From microprocessors to nanostores: Rethinking data-centric systems," Computer, vol. 44, No. 1, pp. 39-48, 2011.

(Continued)

*Primary Examiner* — Tan T. Nguyen
(74) *Attorney, Agent, or Firm* — Meagher Emanuel Laks Goldberg & Liao, LLP

(57) ABSTRACT

According to various embodiments, an in-memory computation system is disclosed. The system includes a dynamic random access memory (DRAM) module. The system further includes a memory controller configured to violate a timing specification for the DRAM module and activate multiple rows of the DRAM module in rapid succession to enable bit-line charge sharing.

29 Claims, 16 Drawing Sheets

(56) References Cited

U.S. PATENT DOCUMENTS

| | | | | |
|---|---|---|---|---|
| 2016/0293228 | A1* | 10/2016 | Won | G11C 7/065 |
| 2016/0359553 | A1* | 12/2016 | Won | H04B 7/24 |
| 2018/0182449 | A1* | 6/2018 | Kim | G11C 5/025 |

OTHER PUBLICATIONS

A. Gutierrez, M. Cieslak, B. Giridhar, R. G. Dreslinski, L. Ceze, and T. Mudge, "Integrated 3d-stacked server designs for increasing physical density of key-value stores," in ACM SIGPLAN Notices, vol. 49, pp. 485-498, ACM, 2014.

A. M. Caulfield, L. M. Grupp, and S. Swanson, "Gordon: using flash memory to build fast, power-efficient clusters for data-intensive applications," ACM Sigplan Notices, vol. 44, No. 3, pp. 217-228, 2009.

J. Ahn, S. Yoo, O. Mutlu, and K. Choi, "Pim-enabled instructions: a low-overhead, locality-aware processing-in-memory architecture," in Computer Architecture (ISCA), 2015 ACM/IEEE 42nd Annual International Symposium on, pp. 336-348, IEEE, 2015.

D. Kim, J. Kung, S. Chai, S. Yalamanchili, and S. Mukhopadhyay, "Neurocube: A programmable digital neuromorphic architecture with high-density 3d memory," in Computer Architecture (ISCA), 2016, ACM/IEEE 43rd Annual International Symposium on, pp. 380-392, IEEE, 2016.

H. S. Stone, "A logic-in-memory computer," IEEE Transactions on Computers, vol. C-19, pp. 73-78, Jan. 1970.

J. Draper, J. Chame, M. Hall, C. Steele, T. Barrett, J. LaCoss, J. Granacki, J. Shin, C. Chen, C. W. Kang, I. Kim, and G. Daglikoca, "The architecture of the diva processing-in-memory chip," in Proceedings of the 16th International Conference on Supercomputing, ICS '02, (New York, NY, USA), pp. 14-25, ACM, 2002.

D. G. Elliott, W. M. Snelgrove, and M. Stumm, "Computational Ram: A Memory-SIMD Hybrid and Its Application to DSP," in 1992, Proceedings of the IEEE Custom Integrated Circuits Conference, pp. 30.6.1-30.6.4, May 1992.

M. Gokhale, B. Holmes, and K. Iobst, "Processing in memory: the terasys massively parallel pim array," Computer, vol. 28, pp. 23-31, Apr. 1995.

P. M. Kogge, "Execube-a new architecture for scaleable mpps," in 1994 International Conference on Parallel Processing vol. 1, vol. 1, pp. 77-84, Aug. 1994.

D. Patterson, T. Anderson, N. Cardwell, R. Fromm, K. Keeton, C. Kozyrakis, R. Thomas, and K. Yelick, "A case for intelligent ram," IEEE Micro, vol. 17, pp. 34-44, Mar. 1997.

Q. Guo, X. Guo, R. Patel, E. Ipek, and E G. Friedman, "AC-DIMM: Associative Computing with STT-MRAM," SIGARCH Comput. Archit. News, vol. 41, pp. 189-200, Jun. 2013.

S. Li, C. Xu, Q. Zou, J. Zhao, Y. Lu, and Y. Xie, "Pinatubo: A processing-in-memory architecture for bulk bitwise operations in emerging non-volatile memories," in Proceedings of the 53rd Annual Design Automation Conference, p. 173, ACM, 2016.

S. Jain, A. Ranjan, K. Roy, and A. Raghunathan, "Computing in memory with spin-transfer torque magnetic ram," IEEE Transactions on Very Large Scale Integration (VLSI) Systems, vol. 26, pp. 470-483, Mar. 2018.

M.-F. Chang, S.-J. Shen, C.-C. Liu, C.-W. Wu, Y.-F. Lin, Y.-C. King, C.-J. Lin, H.-J. Liao, Y.-D. Chih, and H. Yamauchi, 'An offset-tolerant fast-random-read current-sampling-based sense amplifier for small-cell-current nonvolatile memory,' IEEE Journal of Solid-State Circuits, vol. 48, No. 3, pp. 864-877, 2013.

G. De Sandre, L. Bettini, A. Pirola, L. Marmonier, M. Pasotti, M. Borghi, P. Mattavelli, P. Zuliani, L. Scotti, G. Mastracchio, F. Bedeschi, R. Gastaldi, and R. Bez, "A 90nm 4mb embedded phase-change memory with 1.2v 12ns read access time and 1mb/s write throughput," in 2010 IEEE International Solid-State Circuits Conference—(ISSCC), pp. 268-269, Feb. 2010.

K. Tsuchida, T. Inaba, K. Fujita, Y. Ueda, T. Shimizu, Y. Asao, T. Kajiyama, M. Iwayama, K. Sugiura, S. Ikegawa, T. Kishi, T. Kai, M. Amano, N. Shimomura, H. Yoda, and Y. Watanabe, "A 64mb mram with clamped-reference and adequate-reference schemes," in 2010 IEEE International Solid-State Circuits Conference—(ISSCC), pp. 258-259, Feb. 2010.

S. Aga, S. Jeloka, A. Subramaniyan, S. Narayanasamy, D. Blaauw, and R. Das, "Compute caches," in High Performance Computer Architecture (HPCA), 2017 IEEE International Symposium on, pp. 481-492, IEEE, 2017.

V. Seshadri, D. Lee, T. Mullins, H. Hassan, A. Boroumand, J. Kim, M. A. Kozuch, O. Mutlu, P. B. Gibbons, and T. C. Mowry, "Ambit: In-memory accelerator for bulk bitwise operations using commodity dram technology," in Proceedings of the 50th Annual IEEE/ACM International Symposium on Microarchitecture, pp. 273-287, ACM, 2017.

S. Li, D. Niu, K. T. Malladi, H. Zheng, B. Brennan, and Y. Xie, "Drisa: A dram-based reconfigurable in-situ accelerator," in Proceedings of the 50th Annual IEEE/ACM International Symposium on Microarchitecture, pp. 288-301, ACM, 2017.

A. Agrawal, A. Jaiswal, C. Lee, and K. Roy, "X-sram: Enabling in-memory boolean computations in cmos static random access memories," IEEE Transactions on Circuits and Systems I: Regular Papers, No. 99, pp. 1-14, 2018.

J. Potter, "Image processing on the massively parallel processor," Computer, vol. 16, pp. 62-67, Jan. 1983.

K. E. Batcher, E. E. Eddey, R. O. Faiss, and P. A. Gilmore, "SAR processing on the MPP," 1981.

M. Drumheller, "Connection machine stereomatching," 1986.

C. Eckert, X. Wang, J. Wang, A. Subramaniyan, R. Iyer, D. Sylvester, D. Blaaauw, and R. Das, "Neural cache: Bit-serial in-cache acceleration of deep neural networks," in 2018 ACM/IEEE 45th Annual International Symposium on Computer Architecture (ISCA), pp. 383-396, Jun. 2018.

Y. Kim, V. Seshadri, D. Lee, J. Liu, and O. Mutlu, "A case of exploiting subarray-level parallelism (salp) in dram," ACM SIGARCH Computer Architecture News, vol. 40, No. 3, pp. 368-379, 2012.

D. Lee, Y. Kim, G. Pekhimenko, S. Khan, V. Seshadri, K. Chang, and O. Mutlu, "Adaptive-latency dram: Optimizing dram timing for the common-case," in 2015 IEEE 21st International Symposium on High Performance Computer Architecture (HPCA), pp. 489-501, Feb. 2015.

V. Seshadri, Y. Kim, C. Fallin, D. Lee, R. Ausavarungnirun, G. Pekhimenko, Y. Luo, O. Mutlu, P. B. Gibbons, M. A. Kozuch, and T. C. Mowry, "Rowclone: Fast and energy-efficient in-dram bulk data copy and initialization," in 2013 46th Annual IEEE/ACM International Symposium on Microarchitecture (MICRO), pp. 185-197, Dec. 2013.

D. Lee, S. Khan, L. Subramanian, S. Ghose, R. Ausavarungnirun, G. Pekhimenko, V. Seshadri, and O. Mutlu, "Design-Induced latency variation in modern dram chips: Characterization, analysis, and latency reduction mechanisms," Proceedings of the ACM on Measurement and Analysis of Computing Systems, vol. 1, No. 1, p. 26, 2017.

K. K. Chang, A. Kashyap, H. Hassan, S. Ghose, K. Hsieh, D. Lee, T. Li, G. Pekhimenko, S. Khan, and O. Mutlu, "Understanding latency variation in modern dram chips: Experimental characterization, analysis, and optimization," Sigmetrics Perform. Eval. Rev., vol. 44, pp. 323-336, Jun. 2016.

K. Arndt, C. Narayan, A. Brintzinger, W. Guthrie, D. Lachtrupp, J. Mauger, D. Glimmer, S. Lawn, B. Dinkel, and A. Mitwalsky, "Reliability of laser activated metal fuses in drams," in Twenty Fourth IEEE/CPMT International Electronics Manufacturing Technology Symposium, pp. 389-394, Oct. 1999.

K. E. Batcher, "Bit-serial parallel processing systems," IEEE, Transactions on Computers, vol. C-31, pp. 377-384, May 1982.

H. Hassan, N. Vijaykumar, S. Khan, S. Ghose, K. Chang, G. Pekhimenko, D. Lee, O. Ergin, and O. Mutlu, "SoftMC: A Flexible and Practical Open-Source Infrastructure for Enabling Experimental DRAM Studies," in 2017 IEEE International Symposium on High Performance Computer Architecture (HPCA), pp. 241-252, Feb. 2017.

S. Ghose, A. G. Yaglikçi, R. Gupta, D. Lee, K. Kudrolli, W. X. Liu, H. Hassan, K. K. Chang, N. Chatterjee, A. Agrawal, M. O'Connor,

(56) References Cited

OTHER PUBLICATIONS and O. Mutlu, "What your DRAM power models are not telling you: Lessons from a detailed experimental study," CoRR, vol. abs/1807.05102, 2018.

D. Elliott, M. Stumm, W. M. Snelgrove, C. Cojocaru, and R. McKenzie, "Computational ram: Implementing processors in memory," IEEE Design & Test of Computers, No. 1, pp. 32-41, 1999.

M. Oskin, F. T. Chong, and T. Sherwood, "Active pages: a computation model for intelligent memory," in Proceedings. 25th Annual International Symposium on Computer Architecture, pp. 192-203, Jul. 1998.

Y. Kang, W. Huang, S.-M. Yoo, D. Keen, Z. Ge, V. Lam, P. Pattnaik, and J. Torrellas, "FlexRAM: toward an advanced intelligent memory system," in Proceedings 1999 IEEE International Conference on Computer Design: VLSI in Computers and Processors, pp. 192-201, Oct. 1999.

S. Kvatinsky, A. Kolodny, U. C. Weiser, and E. G. Friedman, "Memristor-based imply logic design procedure," in 2011 IEEE 29th International Conference on Computer Design (ICCD), pp. 142-147, Oct. 2011.

S. Kvatinsky, D. Belousov, S. Liman, G. Satat, N. Wald, E. G. Friedman, A. Kolodny, and U. C. Weiser, "MagicâATmemristor-aided logic," IEEE Transactions on Circuits and Systems II: Express Briefs, vol. 61, pp. 895-899, Nov. 2014.

P. Dlugosch, D. Brown, P. Glendenning, M. Leventhal, and H. Noyes, "An efficient and scalable semiconductor architecture for parallel automata processing," IEEE Transactions on Parallel and Distributed Systems, vol. 25, pp. 3088-3098, Dec. 2014.

T. Finkbeiner, G. Hush, T. Larsen, P. Lea, J. Leidel, and T. Manning, "In-memory intelligence," IEEE Micro, vol. 37, No. 4, pp. 30-38, 2017.

Hybrid Memory Cube Consortium, "Hybrid Memory Cube Specification 2.1," 2014.

R. Nair, S. F. Antao, C. Bertolli, P. Bose, J. R. Brunheroto, I. Chen, C. . Cher, C. H. A. Costa, J. Doi, C. Evangelinos, B. M. Fleischer, T. W. Fox, D. S. Gallo, L. Grinberg, J. A. Gunnels, A. C. Jacob, P. Jacob, H. M. Jacobson, T. Karkhanis, C. Kim, J. H. Moreno, J. K. O'Brien, M. Ohmacht, Y. Park, D. A. Prener, B. S. Rosenburg, K. D. Ryu, O. Sallenave, M. J. Serrano, P. D. M. Siegl, K. Sugavanam, and Z. Sura, "Active memory cube: A processing-in-memory architecture for exascale systems," IBM Journal of Research and Development, vol. 59, pp. 17:1-17:14, Mar./May 2015.

M. Gao, G. Ayers, and C. Kozyrakis, "Practical near-data processing for in-memory analytics frameworks," in 2015 International Conference on Parallel Architecture and Compilation (PACT), pp. 113-124, Oct. 2015.

K. E. Batcher, "Architecture of a massively parallel processor," 1980.

K. E. Batcher, "Retrospective: Architecture of a massively parallel processor," in 25 Years of the International Symposia on Computer Architecture (Selected Papers), ISCA '98, (New York, NY, USA), pp. 15-16, ACM, 1998.

K. E. Batcher, "Design of a massively parallel processor," IEEE Transactions on Computers, vol. C-29, pp. 836-840, Sep. 1980.

L. W. Tucker and G. G. Robertson, "Architecture and applications of the connection machine," Computer, vol. 21, pp. 26-38, Aug. 1988.

K. Chandrasekar et al., "Exploiting expendable process-margins in DRAMs for run-time performance optimization," 2014 Design, Automation & Test in Europe Conference & Exhibition (DATE), Dresden, 2014, pp. 1-6, doi: 10.7873/DATE.2014.186.

J. Craninckx and G. van der Plas, "A 65fJ/Conversion-Step 0-to-50MS/s 0-to-0.7mW 9b Charge-Sharing SAR ADC in 90nm Digital CMOS," 2007 IEEE International Solid-State Circuits Conference. Digest of Technical Papers, San Francisco, CA, 2007, pp. 246-600.

D. Kim, J. Kung, S. Chai, S. Yalamanchili and S. Mukhopadhyay, "Neurocube: A Programmable Digital Neuromorphic Architecture with High-Density 3D Memory," 2016 ACM/IEEE 43rd Annual International Symposium on Computer Architecture (ISCA), Seoul, 2016, pp. 380-392.

Liu, Jamie & Jaiyen, Ben & Kim, Yoongu & Wilkerson, Chris & Mutlu, Onur, An Experimental Study of Data Retention Behavior in Modern DRAM Devices: Implications for Retention Time Profiling Mechanisms:, Proceedings—International Symposium on Computer Architecture. 2013.

Monteiro, Cancio & Takahashi, Yasuhiro & Sekine, Toshikazu, "Charge-sharing symmetric adiabatic logic in countermeasure against power analysis attacks at cell level", Microelectronics Journal. 44. 496-503. 2013.

T. Shibata and T. Ohmi, "A functional MOS transistor featuring gate-level weighted sum and threshold operations," in IEEE Transactions on Electron Devices, vol. 39, No. 6, pp. 1444-1455, Jun. 1992.

Yang K., Andreou A.G., "A Multiple Input Differential Amplifier Based on Charge Sharing on a Floating-Gate MOSFET", Analog Integrated Circuits and Signal Processing, vol. 6, pp. 197-208, 1994.

\* cited by examiner

| Group ID:<br>Vendor_Size_Freq(MHz) | Part Number | # Modules |
|---|---|---|
| SKhynix_2G_1333 | HMT325S6BFR8C-H9 | 6 |
| SKhynix_4G_1066 | HMT451S6MMR8C-G7 | 2 |
| SKhynix_4G_1333B | HMT351S6BFR8C-H9 | 2 |
| SKhynix_4G_1333C | HT351S6CFR8C-H9 | 4 |
| SKhynix_4G_1600 | HMT451S6AFR8A-PB | 2 |
| Samsung_4G_1333 | M471B5273DH0-CH9 | 2 |
| Samsung_4G_1333 | M471B5273DH0-CK0 | 2 |
| Micron_2G_1066 | CT2G3S1067M.C8FKD | 2 |
| Micron_2G_1333 | CT2G3S1339M.M8FKD | 2 |
| Elpida_2G_1333 | EBJ21UE8BDS0-DJ-F | 2 |
| Nanya_4G_1333 | NT4GC64B8HG0NS-CG | 2 |
| TimeTec_4G_1333 | 78AP10NUS2R2-4G | 2 |
| Corsair_4G_1333 | CMSA8GX3M2A1333C9 | 2 |

*FIG. 10*

SYSTEM AND METHOD FOR IN-MEMORY COMPUTE

CROSS-REFERENCE TO RELATED APPLICATIONS

This application claims priority to provisional application 62/833,105, filed Apr. 12, 2019, which is herein incorporated by reference in its entirety.

STATEMENT REGARDING FEDERALLY SPONSORED RESEARCH OR DEVELOPMENT

This invention was made with government support under Grant No. CCF-1453112 awarded by the National Science Foundation and under Grant No. FA8650-18-2-7862 awarded by the United States Air Force, AFMC. The government has certain rights in the invention.

FIELD OF THE INVENTION

The present invention relates generally to random access memory and, more particularly, to a hardware or hardware/software scheme that includes memory and a memory controller that allows for computation in the memory.

BACKGROUND OF THE INVENTION

In modern computing systems, moving data between compute resources and main memory utilizes a large portion of the overall system energy and significantly contributes to program execution time. As increasing numbers of processor cores have been integrated onto a single chip, the amount of memory bandwidth has not kept up, thereby leading to a "Memory Wall". Making matters worse, the communication latency between compute resources and off-chip dynamic random access memory (DRAM) has not improved as fast as the amount of computing resources have increased.

To address these challenges, near-memory compute, Processors-in-Memory, and in-memory compute have all been proposed. Focusing on the most aggressive solution, performing computations with the memory resources have relied on either emerging memory technologies or has required additional circuits be added to random access memory (RAM) arrays. While some solutions have been demonstrated in silicon, none of these solutions have gained widespread industry adoption largely due to requiring additional circuits to be added to already cost optimized and low-margin RAM implementations.

As such, there is a need for in-memory computation with little to no change to DRAM architecture.

SUMMARY OF THE INVENTION

According to various embodiments, an in-memory computation system is disclosed. The system includes a dynamic random access memory (DRAM) module. The system further includes a memory controller configured to violate a timing specification for the DRAM module and activate multiple rows of the DRAM module in rapid succession to enable bit-line charge sharing.

According to various embodiments, a method for performing computation in a memory system is disclosed. The memory system includes a dynamic random access memory (DRAM) module and a memory controller. The method includes violating via the memory controller a timing specification for the DRAM module. The method further includes activating via the memory controller multiple rows of the DRAM module in rapid succession to enable bit-line charge sharing.

According to various embodiments, an in-memory computation system is disclosed. The system includes a memory module. The system further includes a memory controller configured to violate a timing specification for the memory module and activate multiple rows of the memory module in rapid succession to enable bit-line charge sharing.

Various other features and advantages will be made apparent from the following detailed description and the drawings.

BRIEF DESCRIPTION OF THE DRAWINGS

In order for the advantages of the invention to be readily understood, a more particular description of the invention briefly described above will be rendered by reference to specific embodiments that are illustrated in the appended drawings. Understanding that these drawings depict only exemplary embodiments of the invention and are not, therefore, to be considered to be limiting its scope, the invention will be described and explained with additional specificity and detail through the use of the accompanying drawings, in which:

FIG. 10 depicts a table of evaluated DRAM modules according to an embodiment of the present invention;

DETAILED DESCRIPTION OF THE INVENTION

Figure 1:
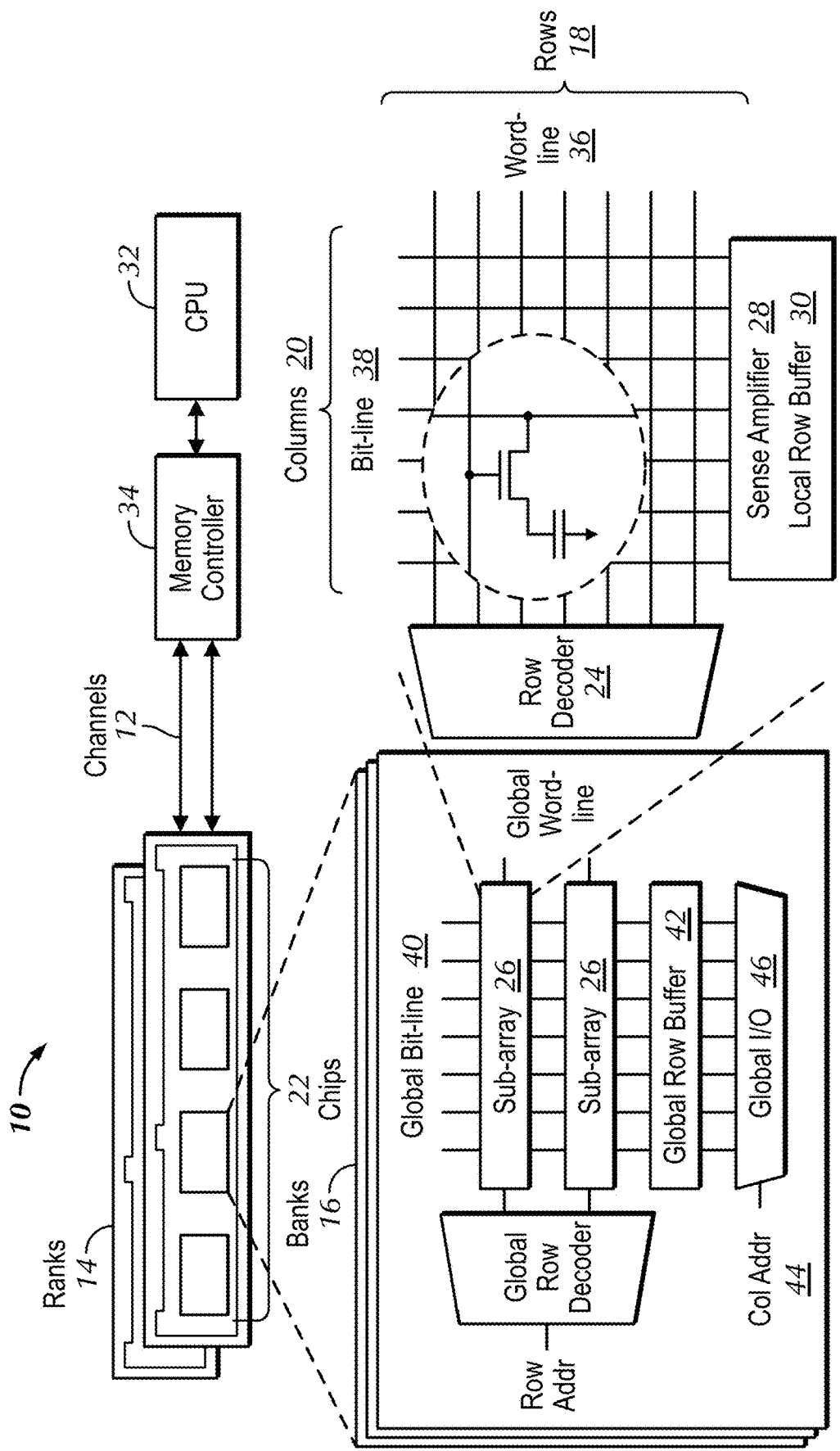
FIG. 1 depicts dynamic random access memory (DRAM) hierarchy according to an embodiment of the present invention.

In-memory computing has long been promised as a solution to the "Memory Wall" problem. Recent works have proposed using charge-sharing on the bit-lines of a memory in order to compute in-place and with massive parallelism, all without having to move data across the memory bus. Unfortunately, this prior work has required modification to Random Access Memory (RAM) designs (e.g. adding multiple row decoders) in order to open multiple rows simultaneously. So far, the competitive and low-margin nature of the dynamic random access memory (DRAM) industry has made commercial DRAM manufacturers resistant to adding any additional logic into DRAM. As such, there is a need for in-memory computation with little to no change to DRAM architecture.

Generally disclosed herein are embodiments for a system and method that demonstrates in-memory computation with an unmodified DRAM. This is accomplished by violating the nominal timing specification and activating multiple rows in rapid succession, which happens to leave multiple rows open simultaneously, thereby enabling bit-line charge sharing. A constraint-violating command sequence is used to implement and demonstrate row copy, logical OR, and logical AND in the unmodified DRAM. Subsequently, these primitives are employed to develop an architecture for arbitrary, massively-parallel computation. Utilizing a customized DRAM controller in an FPGA and commodity DRAM modules, embodiments of this invention are characterized in hardware for all major DRAM vendors. Embodiments generally disclosed herein illustrate that in-memory computation is possible with unmodified DRAM modules and that there exists a financially feasible way for DRAM manufacturers to support in-memory compute.

Embodiments generally disclosed herein utilize a customized memory controller to change the timing of standard DRAM memory transactions, operating outside of specification, to perform massively parallel logical AND, logical OR, and row copy operations. Using these base operations and by storing and computing each value and its logical negation, it is possible to compute arbitrary functions in a massively parallel bit-serial manner. These novel operations function at the circuit level by forcing the unmodified DRAM chip to open multiple rows simultaneously by activating them in rapid succession.

With such a modification to the DRAM controller, in-memory compute is able to save the considerable energy needed to move data across memory buses and cache hierarchies. Embodiments disclosed herein indicate that in-memory computation using DRAM is practical, low-cost, and should be included in all future computer systems. Taking a step further, the robustness of each computational operation is characterized to identify which operations can be performed by which DRAM. While the results show that not all unmodified DRAMs support all operations, the virtue that some unmodified DRAMs do support a complete set of operations demonstrates that DRAM vendors can likely support in-memory compute in DRAM at little to no monetary cost. In-memory compute also shows potential as an alternative to using traditional silicon complementary metal-oxide-semiconductor (CMOS) logic gates for compute. With the slowing and potential ending of Moore's Law, the computing community has to look beyond relying on non-scaling silicon CMOS logic transistors for alternatives such as relying more heavily on in-memory computation.

Embodiments generally disclosed herein have the potential for a large impact on the computing industry with minimal hardware changes. Currently, DRAM is solely used to store data. The novelty disclosed here that DRAM can be used to perform computations, as is, or with nominal modifications by DRAM vendors, means that with a small update to the DRAM controller, all new computers can perform massively parallel computations without needing to have data transit the memory bus and memory hierarchy. This massively parallel bit-serial computation has the potential to save significant energy and can complete computations in-parallel with the main processor. It is envisioned this type of computing can be used for data-parallel applications or sub-routines within a larger application. For instance, such architectures can be applied to image and signal processing, computer vision, and the field of neural networks.

It is to be noted that while embodiments of the present invention were implemented here using DRAM, the systems and methods described can be implemented in other memory technologies as well. Example memory types include but are not limited to High Bandwidth Memory (HBM), Phase Change Memory (PCM), 3D X-Point Memory, Magnetoresistive Random-Access memory (MRAM), FLASH memory, Resistive Random-Access Memory (RRAM), and Spin-Transfer Torque Random-Access Memory (STT-RAM).

DRAM System Organization

A DRAM memory module 10, such as the one illustrated in FIG. 1, follows a hierarchical system organization of: channels 12, ranks 14, banks 16, and rows/columns 18/20. A nonlimiting example organization may have one DIMM (dual in-line memory module) 10 per channel 12, and up to two ranks 14 per module 10. Each rank 14 may include eight physical chips 22, which are accessed in parallel and share the same command bus. When memory is accessed, all chips 22 see the same address, and the data read out from different chips 22 in one rank are concatenated. Each chip 22 may contain eight independent banks 16, and each bank 16 may include a plurality of rows 18 and columns 20 of DRAM memory cells. A row 18 refers to a group of storage cells that are activated simultaneously by a row activation command, and a column 20 refers to the smallest unit of data (one byte per chip) that can be addressed. Since it is impractical to use a single row decoder 24 to address tens of thousands of rows 18 in a bank 16, or to use long bit-lines to connect the cells in a bank 16 vertically, the bank 16 is further divided into sub-arrays 26, each of which typically contains 512 rows 18, though that is not intended to be limiting. Within a sub-array 26, each bit-line connects all the cells in one bit of a column 20 and the sense amplifier 28 at the local row buffer 30.

As the processor 32 (or I/O device) operates, it generates a stream of memory accesses (reads/writes), which are forwarded to the Memory Controller (MC) 34. The role of the MC 34 is to receive memory requests, generate a sequence of DRAM commands for the memory system 10, and issue these commands properly timed across the memory channel 12. Deviation from the DRAM timing specification directly affects the operation. The generated side-effects from non-nominal operation of a DRAM module 10 can affect the stored data. It is these non-nominal side-effects that embodiments of the disclosed invention exploit for performing computation with memory.

DRAM Commands and Timing

This section details the attributes of the DRAM commands and timing that are important for embodiments of the disclosed invention. Four commands are essential for DRAM (PRECHARGE, ACTIVATE, READ, AND WRITE):

PRECHARGE: The PRECHARGE command applies to a whole bank 16. It first closes the currently opened row 18 by zeroing all word-lines 36 in the target bank 16, and subsequently drives all bit-lines to $V_{dd}/2$ as an initial value.

ACTIVATE: The ACTIVATE command targets a specific row 18. Before an ACTIVATE is issued, a PRECHARGE command must be sent to the corresponding bank 16 to ensure the initial voltage on the bit-line is $V_{dd}/2$. In nominal operations, at most one row 18 can be activated in a bank 16 at any time. During ACTIVATE, the word-line 36 of the addressed row 18 is raised high, which connects the cells of that row 18 directly to the bit-lines 38. Charge sharing then occurs between the storage cell and the bit-line 38. Although the capacitance of the cell is relatively small compared to the capacitance of the bit-line 38, it could still make the bit-line voltage slightly higher or lower than $V_{dd}/2$ depending on the value stored in the cell. After the voltage on the bit-line 38 is raised or lowered from $V_{dd}/2$, a sense amplifier 28 is enabled which drags the voltage to $V_{dd}$ or GND, thereby amplifying the value held in the bit-line 38. At the same time, the bit-cell is still connected to the bit-line 38, thus the value in the cell is preserved. Finally, the global bit-lines 40 connect the output of the activated local row buffer 30 to the global row buffer 42.

Figure 2:
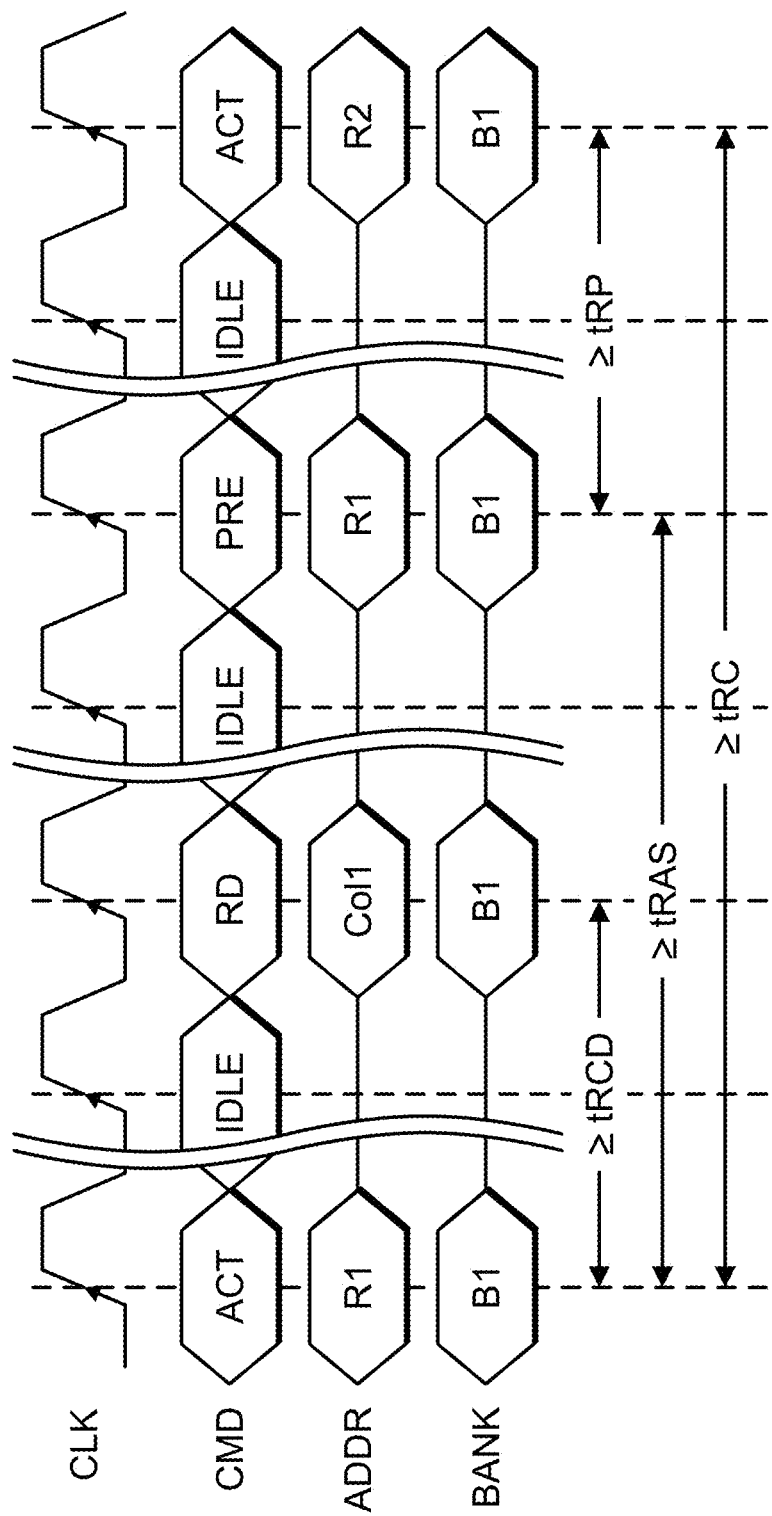
FIG. 2 depicts an example command sequence to read the DRAM from bank $B_1$ to row $R_1$ according to an embodiment of the present invention.

READ/WRITE: The READ/WRITE commands apply to four or eight consecutive columns 20 according to the burst mode. Based on the starting column address 44, the corresponding columns of data in the global row buffer 42 are read out to or written from the I/O pins 46. Nominally, these commands must be sent after a row 18 is activated in that bank 16, so that the target row 18 is stored in the global row buffer 42. As different commands take different amounts of time to complete, it is the responsibility of the memory controller 34 to space out each command in order to not violate the nominal DRAM timing, thereby, ensuring reliable and correct operation. A standard, nonlimiting DRAM read procedure is presented in FIG. 2 with marked time intervals $t_{RCD}$, $t_{RAS}$, $t_{RP}$, and $t_{RC}$, each described further below.

Row Access to Column Access Delay ($t_{RCD}$): the minimum time between an ACTIVATE and a READ/WRITE.

Row Access Strobe ($t_{RAS}$): the minimum time after the ACTIVATE that a PRECHARGE can be sent. This is time used to open a row 18, enable the sense amplifier 28, and wait for the voltage to reach $V_{dd}$ or GND.

Row Precharge ($t_{RP}$): the minimum time after the PRECHARGE in a bank 16 before a new row 18 access. It ensures that the previously activated row 18 is closed and the bit-line voltage has reached $V_{dd}/2$.

Row Cycle ($t_{RC}=t_{RAS}+t_{RP}$): the interval required between accesses to different rows 18 in the same bank 16.

To be described in further detail below, command sequences that violate $t_{RP}$ and $t_{RAS}$ can implement new functionality in DRAM.

Compute in DRAM

DRAM modules 10 rely on MCs 34 for correct operation, meaning that the adherence to DRAM timing constraints and the correct ordering of command sequences are enforced by the MC 34. This responsibility provides opportunities to use the DRAM outside of specification. Violation of timing constraints leads to non-nominal states in the DRAM which can potentially affect the stored data, either constructively or destructively.

This section details how to transform a sequence of commands with nominal timing into a sequence that violates timing constraints but performs in-memory computations. The command sequence and timing pairs are identified that force the DRAM into a state where charge sharing occurs. All previous work in this area required hardware modifications to enable in-memory computing. In contrast, here, by using specially-timed commands that violate the timing specification, row copy and logical AND/OR operations are performed without requiring any hardware modification to the DRAMs.

Figure 3:
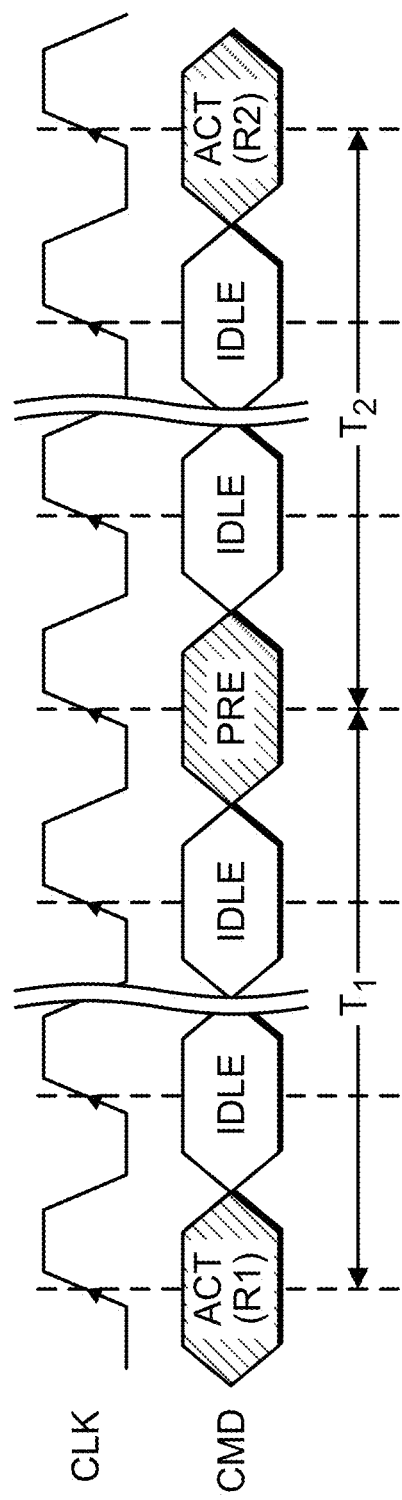
FIG. 3 depicts a command sequence for in-memory operations where $T_1$ and $T_2$ are varied to perform different operations according to an embodiment of the present invention.

The starting point is the command sequence depicted in FIG. 3. Three commands, ACTIVATE($R_1$), PRECHARGE, and ACTIVATE($R_2$), that target two different rows ($R_1$ and $R_2$) of the same bank are executed. The timing intervals between commands are labelled $T_1$ and $T_2$, and are controlled by the number of idle cycles in between. Under nominal operation, where $T_1$ is required to be longer than $t_{RAS}$, and $T_2$ longer than $t_{RP}$, this command sequence will open row $R_1$, close it, and then open row $R_2$, without any effect on the data stored in these rows. However, by appropriately reducing the timing intervals $T_1$ and $T_2$ outside the specification limits, the chip can be forced to reach a non-nominal state that realizes a set of different basic operations.

By violating the timing constraints, three basic in-memory operations are able to be performed: row copy (a copy of data from one row to another), logical AND, and logical OR. To achieve the different basic operations with the same command sequence as seen in FIG. 3, the timing intervals and the initial data stored in memory are manipulated.

Figure 11A:
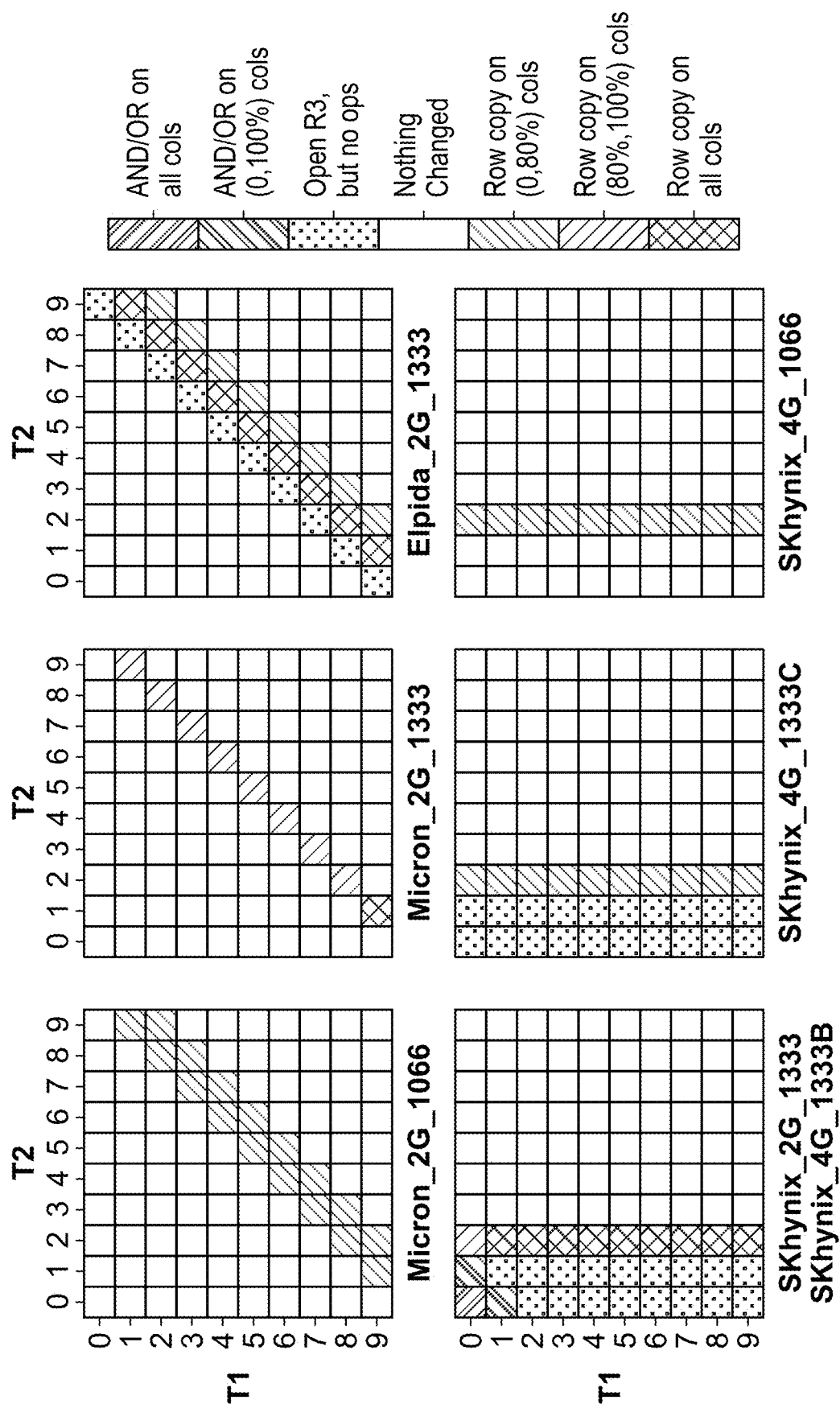
FIGS. 11(a)-(b) depict a heatmap of successfully performed operations for each DRAM group with different timing intervals where the integer timing intervals represent the amount of idle cycles between memory commands and each idle cycle takes 2.5 ns according to an embodiment of the present invention.
Figure 11B:
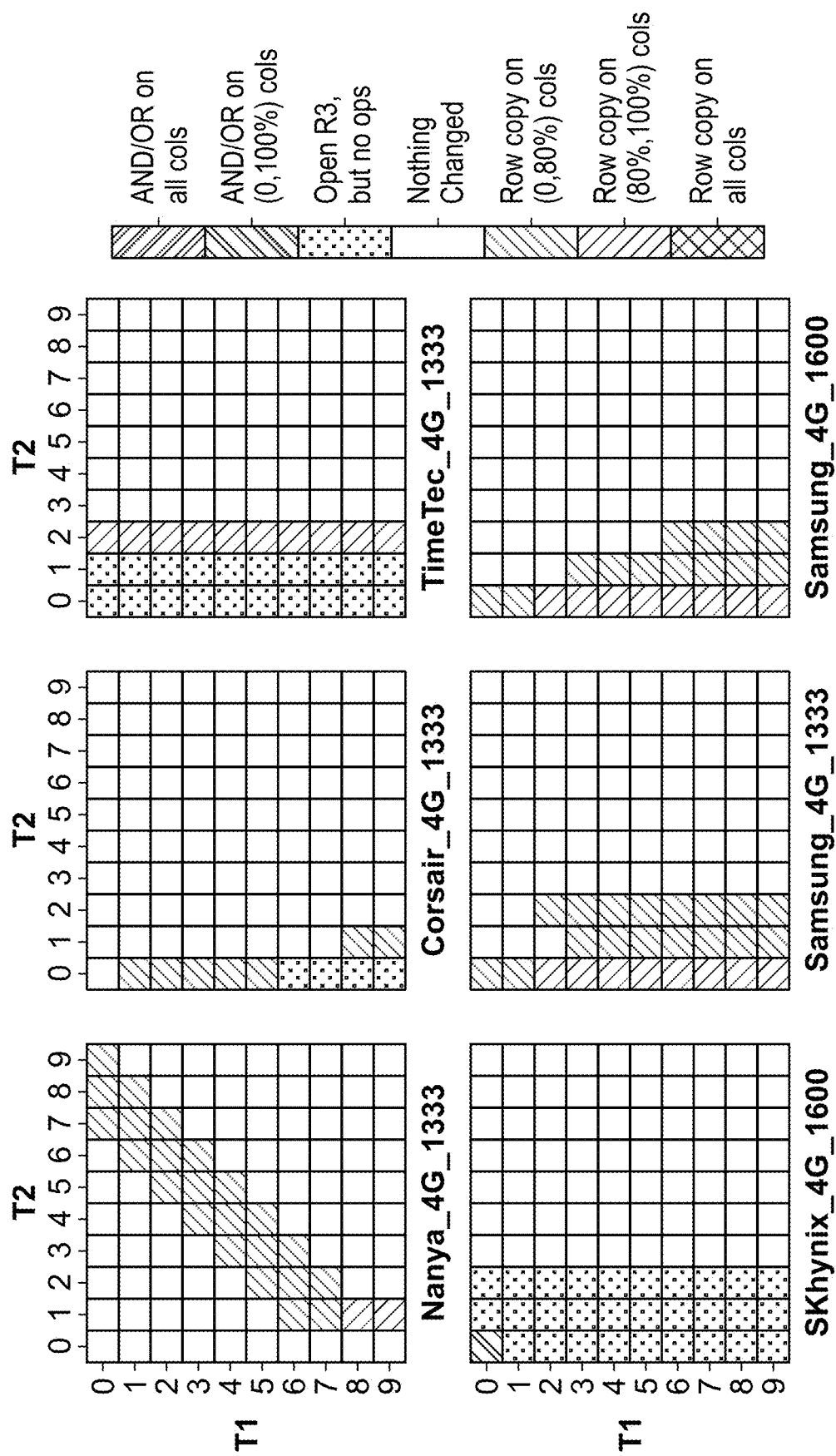

Row Copy:

Row copy is the simplest among the three operations and performs a copy from one row, $R_1$, to another row, $R_2$. To perform row copy, the data of $R_1$ is loaded into the bit-line 38, and then overwrite $R_2$ using the sense amplifier 28. This is achieved by reducing the timing interval $T_2$, shown in FIG. 3, to a value significantly shorter than $t_{RP}$. This causes the second ACTIVATE command to interrupt the PRECHARGE command. In regard to $T_1$, the only requirement for it is to be long enough for the sense amplifier 28 to fully drive the bit-line 38 with the data contained in row $R_1$. Note that the value of $T_2$ must not be too short as it could allow another row to be opened. This can be exploited to construct other operations (AND/OR) but is destructive for row copy. FIGS. 11(a)-(b) show some nonlimiting examples of timing for $T_1$ and $T_2$ to be described in further detail later.

Figure 4:
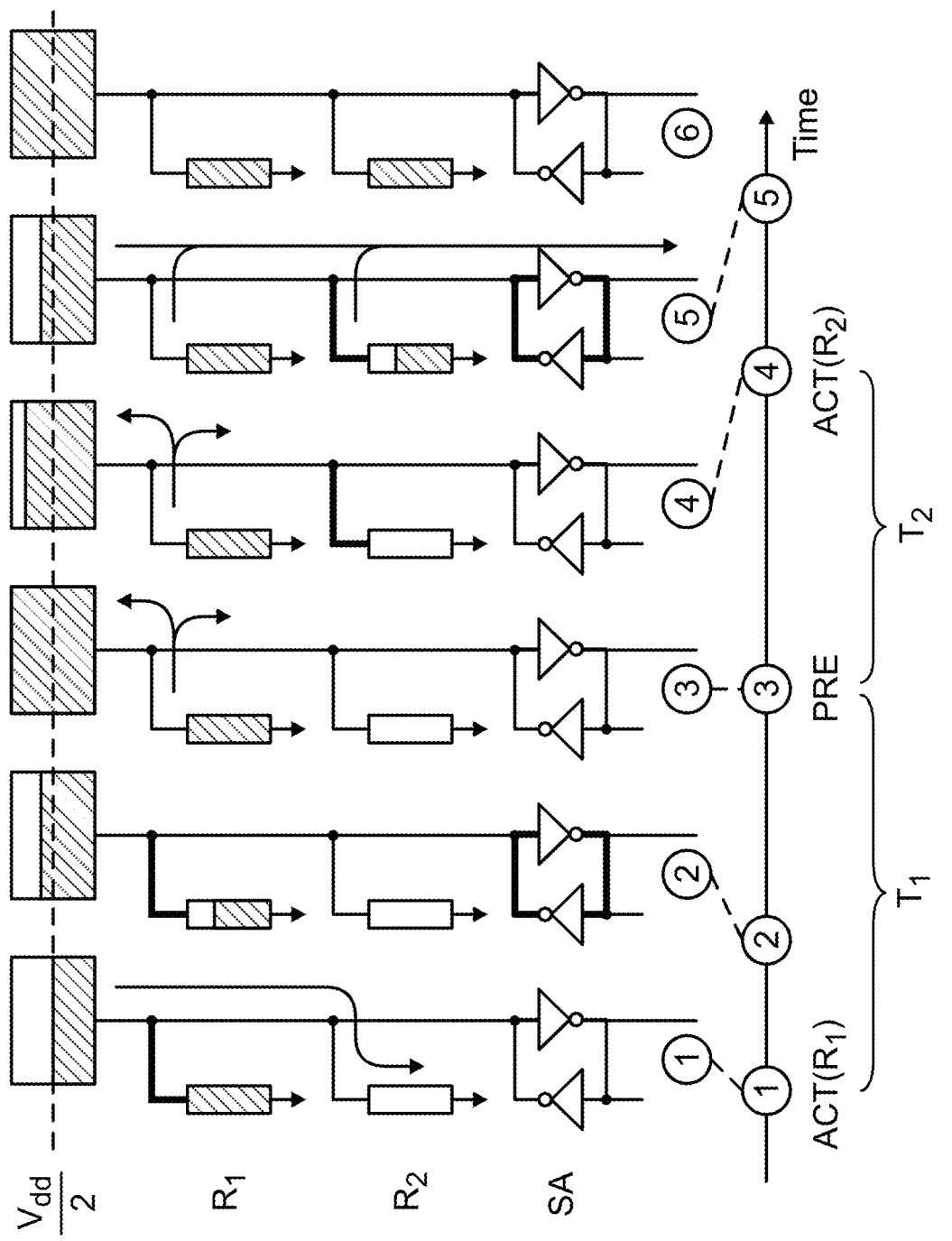
FIG. 4 depicts a timeline for a single bit of a column in a row copy operation where the data in $R_1$ is loaded to the bit-line and overwrites $R_2$ according to an embodiment of the present invention.

As the ACTIVATE and PRECHARGE commands generate the same effect across all columns 20 of a row 18, a single bit of a column is focused on here to provide insight into how row copy works. FIG. 4 provides the timeline of a row copy operation for a single bit of a column 20. The rectangular boxes represent bit-line and cell capacitors. The width of the boxes corresponds to the capacitance (C) and the height of the boxes represents the voltage (V), thus the area of the shaded portion corresponds to the charge (Q=CV). The voltage level of $V_{dd}/2$ is marked on the bit-line capacitor. Bold lines indicate that the word-line 36 is open, or the sense amplifier 28 is enabled.

Starting from left to right in FIG. 4, each step of the operation is shown. The initial state of the column is that of: the bit-line 38 set to $V_{dd}/2$, the cell in $R_1$ charged (storing one), and the cell in $R_2$ discharged (storing zero). In step 1, the first ACTIVATE command is sent, which opens the row $R_1$. Step 2 shows the result of the charge sharing, and the sense amplifier 28 starting to drive both the cell in $R_1$ and the bit-line 38 to $V_{dd}$. This step lasts for a while to allow $R_1$ to recover the charge in its cell. In step 3, the PRECHARGE command is executed, which will attempt to close row $R_1$ and drive the bit-line 38 to $V_{dd}/2$. The state of the column after a period of $T_2$ from executing the PRECHARGE command is shown in step 4. At this point, the word-line 36 of $R_1$ has been zeroed out to close $R_1$, but the bit-line 38 did not have enough time to be fully discharged to $V_{dd}/2$ yet, and the bit-line voltage level is way above the middle point. At the same time, the second ACTIVATE command is executed so as to interrupt the PRECHARGE process. The second ACTIVATE opens row $R_2$ and the charge starts to flow from the bit-line 38 to the cells in $R_2$. As the capacitance of the bit-line 38 is much larger than the capacitance of the cell, a relatively significant amount of charge is stored in the bit-line 38, and the bit-line voltage can still be larger than $V_{dd}/2$ after the charge sharing, as shown in step 5. Thus, when the sense amplifier 28 is enabled to drive the bit-line 38, together with the cell in $R_2$, it will reinforce their values to $V_{dd}$. This successfully completes the copy of data from row $R_1$ to row $R_2$ in step 6.

From the above procedure, two observations can be made. First, the row copy operation relies on charge sharing on the bit-line 38, which requires that the source and destination rows must share the same physical bit-line 38. Thus, due to the physical implementation of banks 16, the row copy operation is restricted to rows within the same sub-array 26. Second, the essential part of row copy is the two consecutive ACTIVATE commands. However, the PRECHARGE command is indispensable to the operation as it was found that the second ACTIVATE would not be recognized by the DRAM if the PRECHARGE command was not interposed before it.

AND/OR:

By further reducing the timing intervals in the command sequence of FIG. 3, three different rows can be opened simultaneously. This allows utilization of the charge sharing result to build logical operations, which happen in-place. When all-zeros or all-ones are stored to one of the opened rows in advance and the command sequence is executed, the logical AND/OR of the other two rows will finally appear in all three rows.

More specifically, in order to perform the logical AND/OR operations, both $T_1$ and $T_2$ are set to the minimum value, which means the ACTIVATE($R_1$), PRECHARGE, and ACTIVATE($R_2$) commands are executed in rapid succession with no idle cycles in between. Assuming that the addresses of the two rows, $R_1$ and $R_2$, are selected appropriately, the resulting command sequence will cause a single third row $R_3$ to be opened implicitly. The timeline of AND and OR operations are presented in FIGS. 5 and 6, respectively. The rows shown in these figures are consistent with the physical layout: the row addresses are 0, 1, and 2 from top to bottom. Notice that both operations use exactly the same commands and timing. The only two differences are the rows used to store operands, which are enclosed in rectangles in the figures, and the operation-selecting constant saved in the remaining row.

Figure 5:
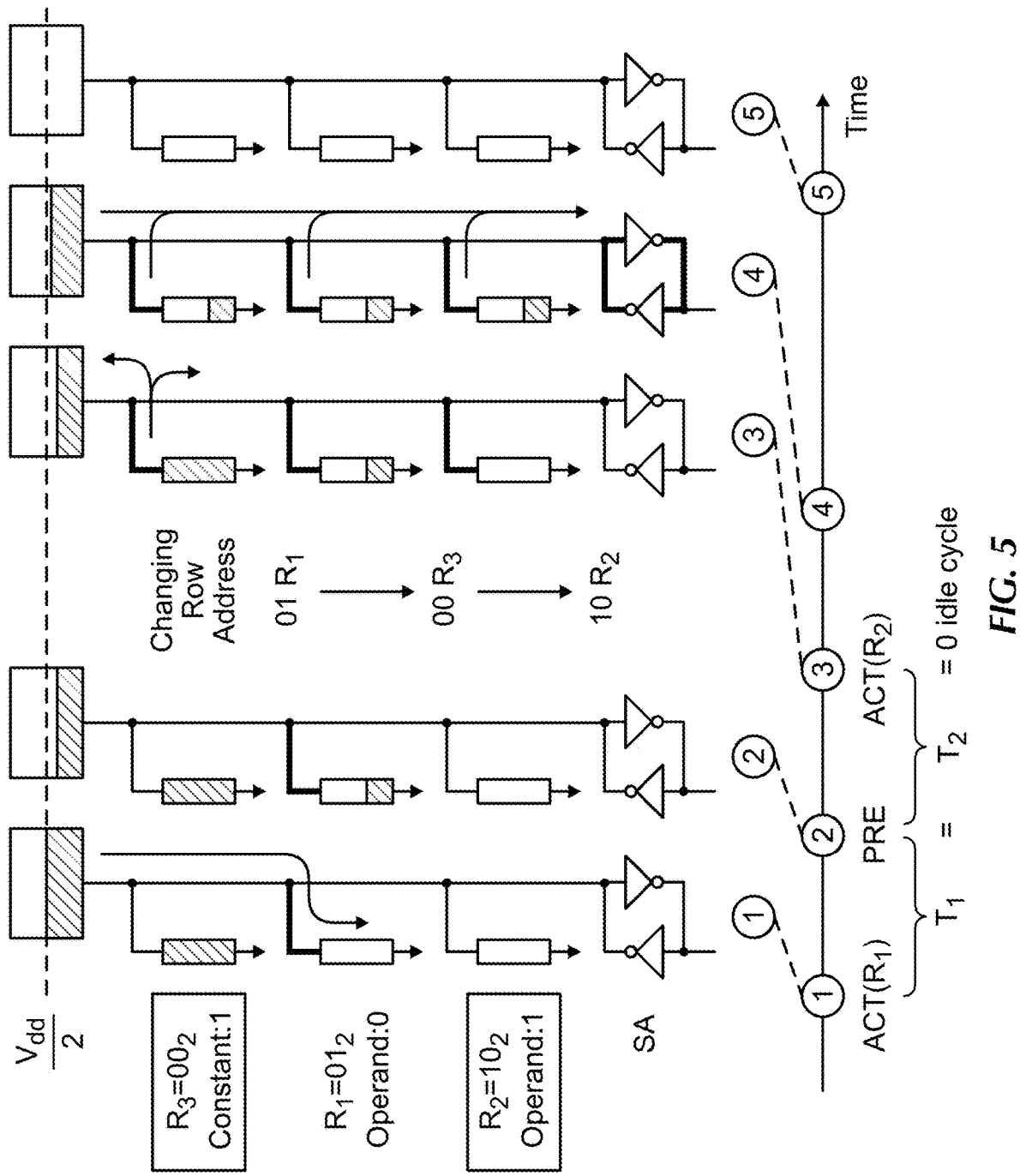
FIG. 5 depicts a logical AND where $R_1$ is loaded with constant zero, $R_2$ and $R_3$ store operands (0 and 1), and the result ($0=1 \wedge 0$) is finally set in all three rows according to an embodiment of the present invention.
Figure 6:
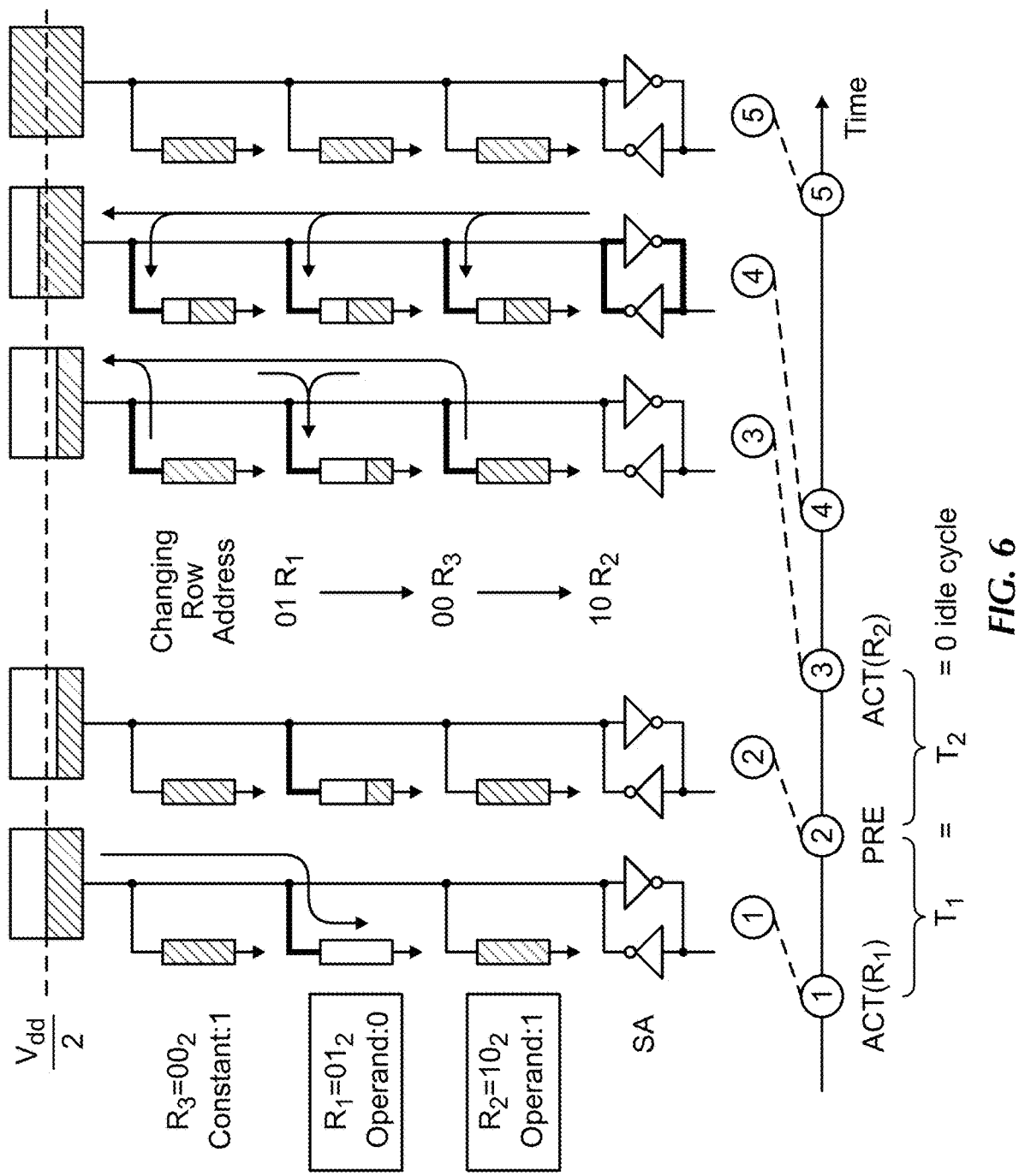
FIG. 6 depicts a logical OR where $R_3$ is loaded with the constant one, $R_1$ and $R_2$ store operands (0 and 1), and the result ($1=1 \vee 0$) is finally set in all three rows according to an embodiment of the present invention.

As before, in step 1 of FIGS. 5 and 6, the first ACTIVATE command is sent which opens $R_1$. In contrast to the procedure for row copy, the first ACTIVATE is interrupted by sending the PRECHARGE immediately after it in step 2. Due to the short timing interval, $T_1$, between the two commands, the sense amplifier 28 is not enabled yet. This is important, because otherwise, the value in $R_1$ will be restored in the bit-line 38 and will overwrite other rows in the end. In step 3, the second ACTIVATE is sent, thus interrupting the PRECHARGE command. As described earlier, the PRECHARGE command does two things: it zeros out the word-line 36 to close the opened row, and drives the bit-line 38 to $V_{dd}/2$. An adequately small $T_2$ timing interval can prevent both parts from being realized, meaning that the opened row $R_1$ will not be closed. On its execution, the second ACTIVATE command will change the row address from $R_1$ to $R_2$. In the process of changing the activated row address, an intermediate value $R_3$ appears on the row address bus. Previously, the PRECHARGE was interrupted right in the beginning, so the bank 16 is still in the state of "setting the word-line 36" as in the activation process. This will drive the word-line 36 according to the value on the row address bus, leading to the opening of the intermediate row $R_3$. Besides this intermediate row, the specified destination $R_2$ will be opened at the end of step 3. Remember that $R_1$ is kept open from the start, therefore three different rows are simultaneously activated. After the charge sharing, all cells and the bit-line 38 reach to the same voltage level in step 4. Whether the resultant voltage is above $V_{dd}/2$ or not depends on the majority value in the cells of $R_1$, $R_2$, and $R_3$; it will be later described how to implement logical AND/OR based on this by setting the operation-selecting constant row in advance. Finally, in step 5, the result is stored in all three rows. Similar to the row copy operation, the logical AND/OR operations can be performed only within rows of the same sub-array 26.

An important consideration when implicitly opening a third row 18 is how to control which row 18 is opened. According to embodiments disclosed herein, when $R_1$ is $01_2$ and $R_2$ is $10_2$, $R_3=00_2$ is opened. Furthermore, it is observed that the order of activation influences the behavior: when $R_1$ and $R_2$ are $10_2$ and $01_2$ respectively, $R_3=11_2$ is opened instead. Based on this observation, the row address may be updated from least to most significant bit, as shown in the middle section of FIGS. 5 and 6. Notice that in the case that the addresses of $R_1$ and $R_2$ have more divergence in their bits, it was found that additional rows (more than three) are opened. To exert control over the behavior of the operations and for simplicity, the lower two bits of the addresses of $R_1$ and $R_2$ are fixed to $01_2$ and $10_2$ and require their higher bits to be identical. This forces the address of $R_3$ to have its two lower bits be $00_2$ and higher bits be the same as $R_1$ and $R_2$, ensuring that only one intermediate row is activated.

It is now discussed how the content of the rows 18 affects the outcome of the operation, and how to construct logical AND/OR. Theoretically, assuming that the cell capacitance in all three rows 18 is the same and that they are activated simultaneously, the outcome of the operation would be the majority value. That is, if at least two rows 18 hold a value of one, the outcome will also be one, and vice versa.

Figures 7, 8:
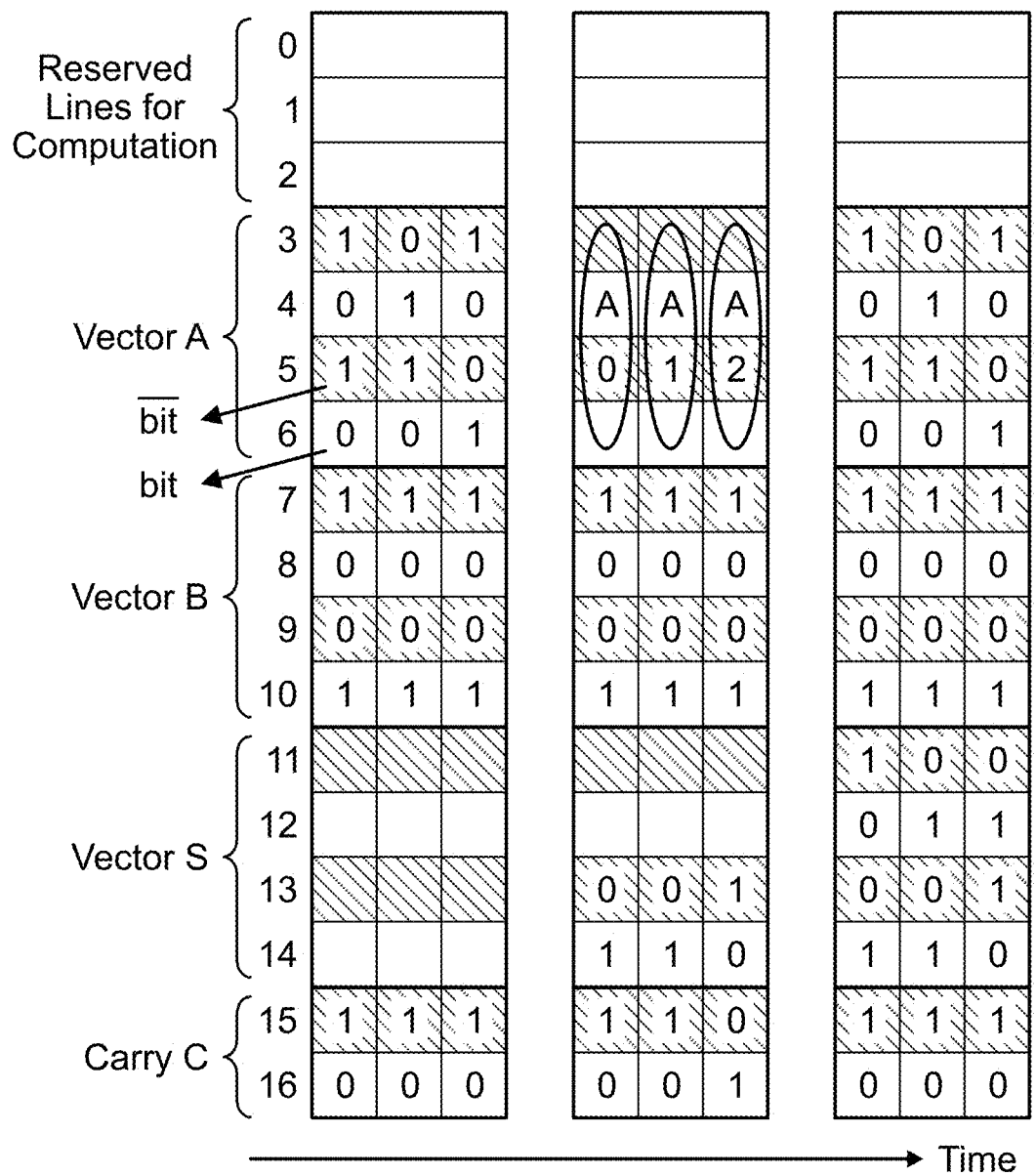
FIG. 7 depicts a truth table for the results produced from charge sharing among rows $R_1$, $R_2$, and $R_3$ according to an embodiment of the present invention.
FIG. 8 depicts an example of element-wise ADD where each vector has three 2-bit elements and each element is stored vertically according to an embodiment of the present invention.

However, in reality, row $R_1$ is opened first, therefore it has more time to influence the bit-line 38, thus the three rows 18 are not equivalent. FIG. 7 presents the truth table from experimentally collected results for all combinations of values in $R_1$, $R_2$, $R_3$. Apart from the combination where $R_1=1$, $R_2=0$, and $R_3=0$, marked with X to indicate an unpredictable outcome, all other combinations generate the desired result. Based on this observation, the combinations from the truth table in FIG. 7 that generate robust results are only used, choosing the appropriate rows as operands and the remaining as the initial constant, to implement the logical AND/OR operations. Fixing the value of $R_1$ to zero reduces the truth table to the dotted circle, meaning a logical AND would be performed on the values in $R_2$ and $R_3$. Similarly, by fixing the value of $R_3$ to constant one, the truth table is reduced to the solid circle, this time performing a logical OR on the values in $R_1$ and $R_2$.

Therefore, in addition to the timing intervals, another prerequisite of logical AND/OR is the constant zero/one. Before an AND operation is performed, all-zeros need to be copied to the row $R_1$. For OR operation, similarly, all-ones need to be copied to the row $R_3$. When the DRAM is initialized for computation, constant zeros and ones are stored into two reserved rows 18 in each sub-array 26.

Influence on Refresh Rate:

Compared with normal memory access, it should be considered whether the disclosed in-memory compute operations require a closer previous refreshment and whether they give a shorter retention time to the cells they touch. For the logical AND/OR operations, it is assumed that the cells in all three operand rows are fully charged/discharged, which means they need to be refreshed just before the operation. To be described further below, operands are copied to reserved rows to perform AND/OR, thus they are always recently refreshed. For row copy, the first ACTIVATE is not interrupted and the sense amplifier is enabled. So, as long as the charge in the cell is good for a normal access, it should be good for a row copy. Enough time is preserved after the last ACTIVATE for both row copy and AND/OR, thus the retention time should not be influenced. Only the retention time for the source row in a row copy might be reduced due to a short T1 (in FIG. 3). However, the length of T1 is not critical to the functionality, and can be enlarged to make it more conservative.

Operation Reliability:

Previous sections described the command sequence and timings that perform the row copy and logical AND/OR operations. Under ideal conditions, the operations should reliably produce the desired computations. However, through experiments, it was observed instances of rows 18 and columns 20 that when utilized would produce erroneous results. The source of these errors stems from manufacturing variations across columns 20 and the practice of row remapping to circumvent faulty cells.

Due to imperfections in the manufacturing process, size and capacitance of elements are not uniform across the chip. These variations make the columns 20 behave differently given the same command sequence. The behavior divergence leads to a partial execution of an operation (e.g., only a portion of the columns 20 in a row 18 are copied with a row copy operation), or erroneous results. The offending columns 20 are not necessarily incapable of performing the operation. Rather, it was found that often they require different timing intervals to achieve the operation. As it is not always possible to find a timing interval that makes all columns 20 work, the timing interval that covers most columns 20 is selected. The columns 20 that still fail to perform the operation are regarded as "bad" columns and are excluded from in-memory computations.

Apart from variations due to the manufacturing process, imperfections that render some DRAM cells unusable can also manifest. Such errors are discovered and resolved during post-manufacturing testing, with the row addresses pointing to these faulty cells being remapped to redundant rows. This creates a complication to the disclosed technique. To perform the in-memory computing operations, it is ensured that the operand rows 18 are in the same sub-array 26 by checking their addresses. However, for the remapped rows, the row addresses are not consistent with the physical locations. As it cannot be guaranteed that they are in the same sub-array 26 with any other row 18, these are marked as "bad" rows to be excluded from in-memory computations.

In-Memory Compute Framework

The previous section described how to implement three basic in-memory operations. However, the three operations fall short of allowing performance of arbitrary computations as inversion is needed for generality. Furthermore, as variations and defects in DRAM memories are inevitable, there will always be rows 18 and columns 20 that cannot be used for computation. As such, the following section discloses a software framework that can perform arbitrary computations using the three basic operations as building blocks. Further addressed is the issue of errors due to process variation and manufacturing imperfections.

Arbitrary Computations with Memory

Having the row copy and logical OR/AND operations as a starting point, the missing functionality for arbitrary computations is the NOT operation. The disclosed approach avoids modifications to DRAM design and requires the existence of both the regular and the negated version of a value to perform computations. Thus, all variables in the disclosed model include two parts: one in regular form and one negated. The availability of both versions is then utilized to create universal functions such as NAND, which could be used to build arbitrary computations. Equations 1 to 5 provide examples of different possible operations.

$$\text{NOT: } \neg(A,\overline{A})=(\overline{A},A) \tag{1}$$

$$\text{AND: } (A,\overline{A}) \wedge (B,\overline{B}) = (A \wedge B, \overline{A} \vee \overline{B}) \tag{2}$$

$$\text{OR: } (A,\overline{A}) \vee (B,\overline{B}) = (A \vee B, \overline{A} \wedge \overline{B}) \tag{3}$$

$$\text{NAND: } \neg((A,\overline{A}) \wedge (B,\overline{B})) = (\overline{A} \vee \overline{B}, A \wedge B) \tag{4}$$

$$\text{XOR: } (A,\overline{A}) \oplus (B,\overline{B}) = ((\overline{A} \wedge B) \vee (A \wedge \overline{B}), (\overline{A} \vee \overline{B}) \wedge (A \vee B)) \tag{5}$$

The right-hand side of all equations is constructed using only logical AND and OR. To allow for arbitrary computations at any given point of execution, for every nominal computation, additional steps need to be taken to generate the negated pair. For example, to compute XOR between A and B, using only AND/OR operations and the negated inputs, three operations are required: $\overline{A} \wedge B$, $A \wedge \overline{B}$, and the logical OR of the two previous results. Under the disclosed scheme, an additional three operations ($\overline{A} \vee \overline{B}$, $A \vee B$, and the logical AND of the two previous results) are required to compute XNOR, so as to extend the pairwise value invariant of the disclosed framework to subsequent computations. As is evident, the adoption of a pairwise value format utilizes twice the amount of memory space and twice the number of operations. Compared to the improvements in functionality, these overheads are acceptable. The performance overhead imposed by the pairwise value format is alleviated by the mass parallelism that row-wise computation enables. Furthermore, all the negated intermediate values do not all have to be calculated for some complex functions. Through logical minimization, some intermediate steps can be reduced.

Implementation Choices:

AND and OR operations can be performed on many different pairs of rows 18 in one sub-array 26. But as shown in FIGS. 5 and 6, the computation result overwrites the data in all of the three opened rows. In order to preserve the operands, and also to make the software simple and consistent, the computation is only performed in the first three rows 18 in each sub-array 26. More specifically, the lower nine bits of $R_1$, $R_2$, and R3 are always $000000001_2$, $000000010_2$, and $000000000_2$ (assuming 512 rows 18 in a sub-array 26). These three rows 18 in each sub-array 26 are reserved for computation in the disclosed model. With more complex software, more operations can be performed in place without moving data to the designated rows. But for simplicity, row copy is currently always used to copy the operands and the operation-selecting constant to these three reserved rows, perform the computation, and copy the result back to the destination row.

Bit-Serial Arithmetic:

As the disclosed operations work at row-level, a parallelism of 65536× can be achieved computation is performed at a single-bit granularity. Even more parallelism can be achieved if multiple DRAMs are used on a shared command bus. This makes bit-serial computation a great candidate for embodiments of the disclosed invention.

Bit-serial computing has been previously used with success in applications such as image and signal processing, Deep Neural Networks (DNN), and computer vision due to the extremely high throughput it can provide. Another benefit is the flexibility for arbitrary width computation. The most important reason to use bit-serial computing is that if a bit-parallel approach was used instead, complex operations, such as addition, which require carry propagation, would not be able to be performed. This is because the use of DRAM prohibits propagating carry across different columns.

Here, to perform an operation in DRAM, the input vectors should be aligned, and have the same length and width. The Least Significant Bit (LSB) of the value resides in the lowest row of that vector. The negated bit is stored in the row right above the nominal bit; the rows holding the negated data are shaded in the FIG. 8.

A vector containing m n-bit items is stored in 2n rows and m bits of columns, with each item occupying one bit, out of eight, of a column. Due to the pairwise value format described earlier that allows for arbitrary computations, a total of 2n rows are required. FIG. 8 provides an example of an addition in such a scheme, and a visualization of how the data of a bit-serial computation scheme would be laid out in DRAM. The example works on two, 2-bit operand vectors, A and B, where A has three items: 0, 2, 1, and the items in B are all 1. The row addresses are marked on the left. As mentioned earlier, the first three rows—0, 1, and 2—are reserved for performing operations. The rows reserved for carry propagation—15 and 16—are also visible. The rows holding the all-one and all-zero and the rows allocated for intermediate results are omitted.

At first, the carry bits are initialized to zero using the all-zero constant row. The computation proceeds from low bits to high bits. Rows 5, 6, 9, 10 are used to calculate the LSB of the summation vector S and the carry C. The DRAM operations are applied to the entire row, so all of the three items in S are generated in parallel. The same operation is performed for subsequent bits, until all bits are processed. Finally, the carry bit indicates if any of the items in S have overflowed.

Copy Across Sub-Arrays:

As computation progresses and the variable space grows, it may be required to move data across bank sub-arrays 26. However, this cannot be achieved using the in-memory row copy operation, as rows 18 in different sub-arrays 26 do not share the same bit-lines 38. In such cases, it is disclosed to read the whole row 18 from the source sub-array 26, store the data in the MC 34, and then write it into the destination sub-array 26. Although the MC 34 would require multiple READ/WRITE commands to go through the columns 20 of the entire row 18, this approach is preferable to the alternative of moving the data between the memory 10 and processor 32, as it reduces the distance that data has to travel.

Error Table:

Finally, an essential part of our disclosed framework is to address the reliability problems brought up earlier. The problem of "bad" rows and columns is resolved by excluding them from computations in software. This requires that a thorough scan be performed on the entire module 10 before it is utilized. The scanning process would generate an address record of the discovered "bad" columns and "bad" rows; the address record table may be referred to as an "error table". The error table is utilized on a custom address translation layer between the software library and the memory command scheduler. Depending on the embodiment, scanning can be performed by an initialization software program or can be integrated into the memory controller hardware.

From the perspective of the software library, the items in one vector are stored in consecutive columns and rows, indexed by virtual addresses. As the software invokes the provided API functions to perform in-memory computations, the translation layer while translating virtual to physical addresses skips "bad" columns and "bad" rows. After the appropriate remapping, the command sequence is sent from the memory command scheduler. A re-scan of the DRAM module may be performed periodically to update the error table with columns and rows that became "bad" as a result of natural wear out or changes in environmental variables (e.g. temperature).

Figure 9A:
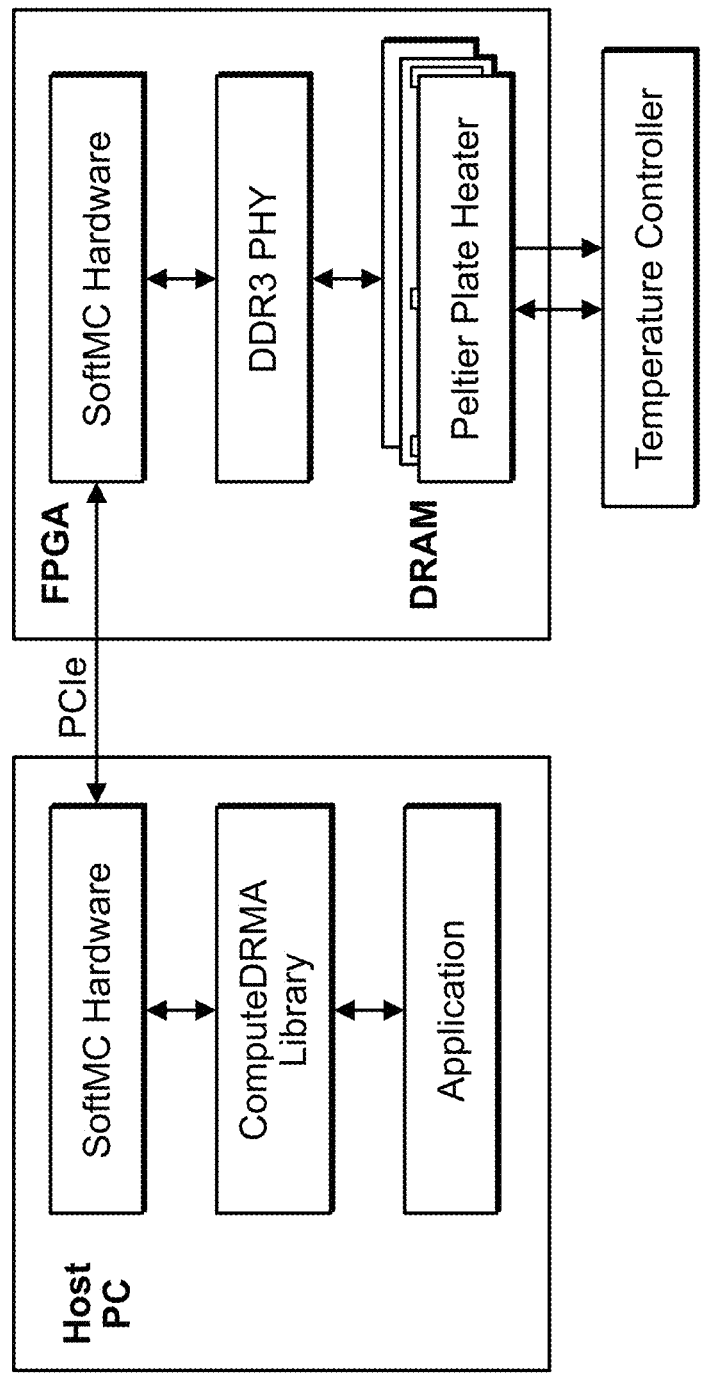
FIG. 9(a) depicts a schematic diagram of a testing framework for in-memory compute according to an embodiment of the present invention.
Figure 9B:
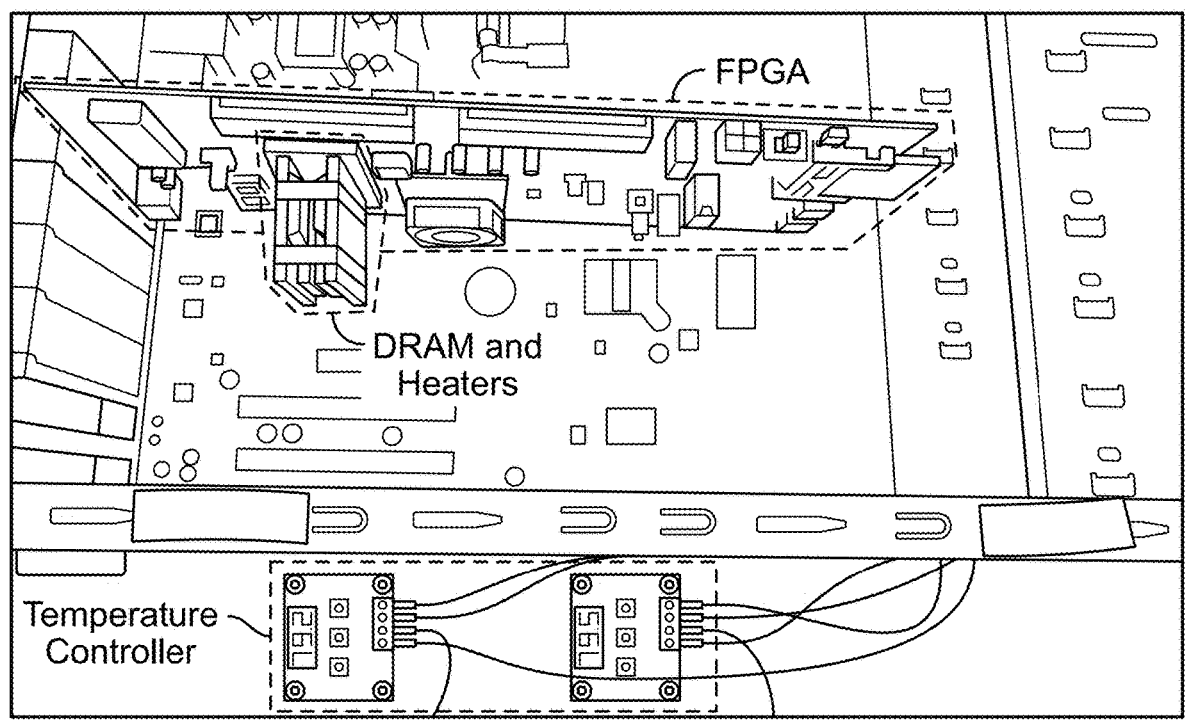
FIG. 9(b) depicts a picture of the testbed according to an embodiment of the present invention.
Figure 9C:
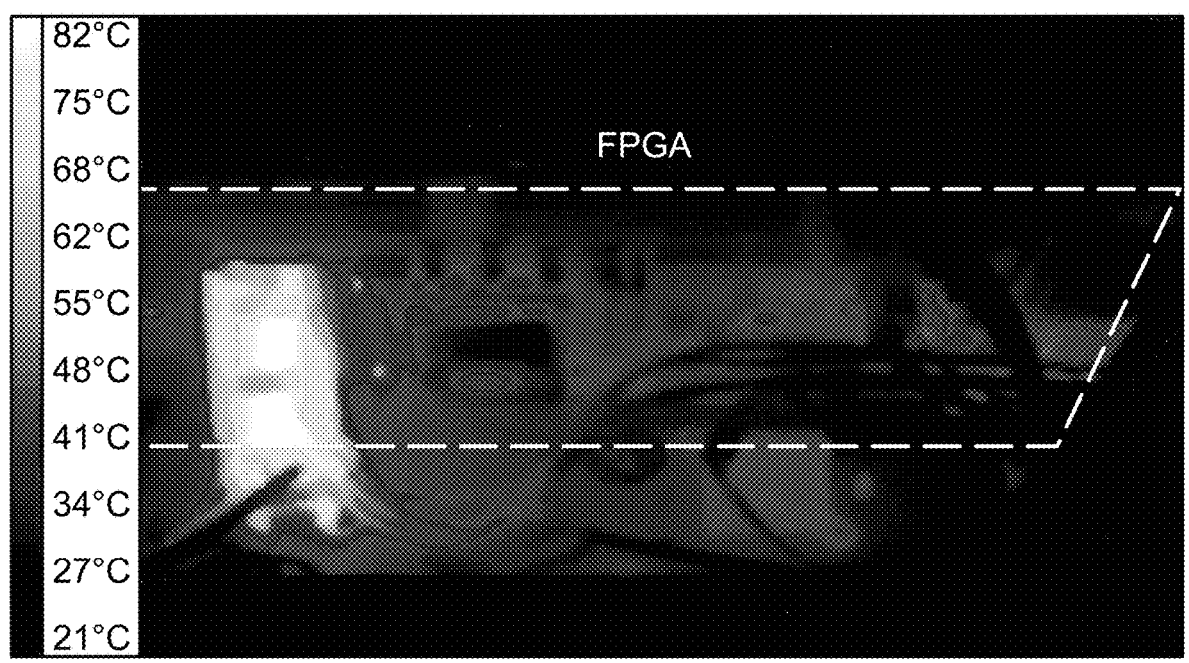
FIG. 9(c) depicts a thermal picture when the DRAM is heated to 80° C. according to an embodiment of the present invention.

Evaluation of Embodiments of the Present Invention:

Embodiments of the present invention were evaluated using a set of custom testbeds, each including a host system and a Xilinx ML605 FPGA board connected through a PCIe bus. FIGS. 9(*a*)-(*c*) present a schematic diagram and photos of the hardware testbed.

SoftMC v1.0 [30], an open-source programmable memory controller, was leveraged to directly control the DRAM module attached to the FPGA. Here, SoftMC was extended to support dual-rank modules and to allow reading and writing non-repetitive bytes in a burst. SoftMC enables experimenting with different command sequences and timing intervals, but also imposes limitations. The dependence of SoftMC on the Xilinx Vertex-6 MIG module constrains the operating frequency of the memory command bus and data bus at 400 MHz and 800 MHz, respectively, regardless of the maximum attainable rate of the DRAM module. As a result, the timing intervals here are quantized to multiples of 2.5 ns. SoftMC can only address a fixed portion of DRAM: a single rank, containing eight banks, each having 1K columns and 32K rows. Thus, the overall addressable memory is constrained to 2 GB. The limitations of SoftMC do not influence embodiments of the present invention as the provided functionality enables a representative space for exploration. As, currently, there is no open source command-level memory controller for DDR4, DDR3 chips were used for evaluation. Although DDR4 has a higher working frequency and a lower $V_{dd}$, its basic commands are exactly the same as DDR3. Thus, DDR4 also presents opportunity for performing in-memory operations.

For assessing the effect of different supply voltages on the operation's robustness, the power management module of our FPGA was re-programmed to control the supply voltage of the DRAM. For accessing the effect of temperature on the reliability, a custom setup was created using peltier devices to heat up both sides of the DRAM modules; temperature was controlled through temperature controller boards.

The software framework described earlier was implemented by wrapping the software API of SoftMC in functions that implement basic (row copy, logical AND/OR) and complex (XOR, ADD) operations, thus providing a higher-level programming interface and primitives to the user. For all basic operations, the sequence of DRAM commands is first buffered on the FPGA and then sent to memory as a carefully timed batch by the hardware part of SoftMC. This ensures that the latency of the PCIe bus does not affect the timing in operations.

The disclosed techniques are evaluated and their behavior is characterized across a wide range of DRAM chips. A total of 32 DDR3 DRAM modules from seven different manufacturers are evaluated, using at least two modules from each configuration. Each module is clustered in one of 13 groups based on its configuration and part number. The table in FIG. 10 provides a detailed breakdown of the different DRAM configurations used. The frequency in the group ID refers to the maximum attainable data bus frequency. As mentioned earlier, the testing infrastructure issues memory commands at a fixed frequency of 400 MHz to all the modules, and the data bus frequency is always 800 MHz.

Proof of Concept:

To validate the feasibility of computing with memory, a test benchmark was built based on the command sequence in FIG. 3. The test benchmark selects a random sub-array from each bank of a DRAM module and performs an exploratory scan to identify pairs of timing intervals that produce successful computations.

At the beginning of the test, the sub-array is initialized to predetermined values. Following the execution of the command sequence with a given pair of timing intervals, the target subarray is read out. Based on the comparison with the predetermined values, it is checked whether any computation is performed or not. If row copy or logical AND/OR is found, the type of computation and the row-wise success ratio is recorded. The row-wise success ratio is defined as the ratio of columns with successful computation over the total number of columns in a row. The test on all 32 modules was run.

FIGS. 11(a)-(b) present the results of the exploratory scan for the 13 different DRAM groups. Due to similarity of results across modules of the same group, it was opted to demonstrate the result of a single module from each group. Two of the groups, SKhynix_2G_1333 and SKhynix_4G_1333B, have exactly the same results, so a single heatmap is used for them.

Each shaded box in the heatmap provides the row-wise success ratio for a given pair of timing intervals in command cycles. Thus, a timing interval $T_1=2$ will introduce two idle cycles (5 ns) between the first ACTIVATE and the PRE-CHARGE commands in FIG. 3. As the test is more interested in capturing the feasibility of an operation, each heatmap is plotted using the results from the bank that provided the highest row success ratio for each module. Using the selected timing interval pair, correct results were able to be produced in at least one subarray across all bits of a row. FIGS. 11(a)-(b) illustrate that row copy and logical AND/OR can be performed using unmodified DRAM.

In more detail, from FIGS. 11(a)-(b), it is observed that nearly all configuration groups present the capability of performing row copy in at least a portion of the columns in a sub-array. Furthermore, it is observed that successful timing interval configurations for row copy follow two patterns: the vertical line pattern and the diagonal line pattern, with most groups exhibiting a vertical line pattern. The timing interval pairs in the vertical line pattern support the explanation described earlier, where it was explained that row copy can be implemented using a small $T_2$ timing interval. In contrast, DRAMs from Micron, Elpida, and Nanya exhibit a diagonal pattern. In these cases, it may be the sum of $T_1$ and $T_2$ that determines whether the row copy operation is performed. Thus, the success of the operation depends on the timing interval between the two ACTIVATE commands, with the timing of the intermediate PRE-CHARGE command not affecting the operation. More specifically, DRAM modules in those groups may perform a check on the timing interval between the first ACTIVATE and the PRECHARGE command, and if the subsequent PRECHARGE command is scheduled too close to the previous ACTIVATE, it will not be issued immediately. That is, the PRECHARGE command is buffered inside the chip and is scheduled with a delay, meaning that the effective $T_2$ timing interval is smaller than the one externally defined in the test benchmark. Thus, the operational rationale for row copy operation in those groups can still be explained by row copy being implemented using a small $T_2$ timing interval.

In regard to logical AND/OR operations, it is observed that only DRAMs in groups SKhynix_2G_1333 and SKhynix_4G_1333B are able to perform the operations across all columns of the sub-array. Modules in group SKhynix_4G_1600 can also perform both operations but not across all columns of the sub-array. Although only limited groups exhibit the capability of performing AND/OR operations, half of the groups are able to open a third row. To realize the logical operations, charge sharing among three different rows is required, therefore opening a third row is the key prerequisite for logical operations. Since these groups have met this key prerequisite, they have the potential to perform AND/OR operations at a different command frequency.

Overall, the most important observation from FIGS. 11(a)-(b) is the existence of unmodified DRAM modules in which both in-memory row copy and logical AND/OR operations can be performed. Furthermore, all vendors have some configurations of DRAM that can perform the row copy operation. The modules in the identified working group, SK Hynix DDR3 DRAMs at 1333 MHz, are fabricated and distributed as regular DRAM memory, and have a wide adoption in commercial configurations. Based on the above, logical AND/OR operations could also become operational in other DRAM modules with minimal hardware modifications and cost. Specifically, for the modules that cannot perform operations, there may exist hardware in them that checks the timing of operations and drops commands that are too tightly timed. Removing, or making configurable, this portion of the design is feasible without significant overhead.

Robustness of Operations:

After presenting a proof of concept for in-memory computing using off-the-shelf DRAM modules, a more thorough exploration of the behavior of each operation is provided below. An important consideration for the practical application of embodiments of the disclosed invention is to find out the portion of the DRAM chip that can be reliably utilized. To assess that, a more detailed robustness test for each operation was performed. The robustness test was performed under nominal supply voltage (1.5V) and at room temperature (chip temperature=25-30° C.).

Figure 12:
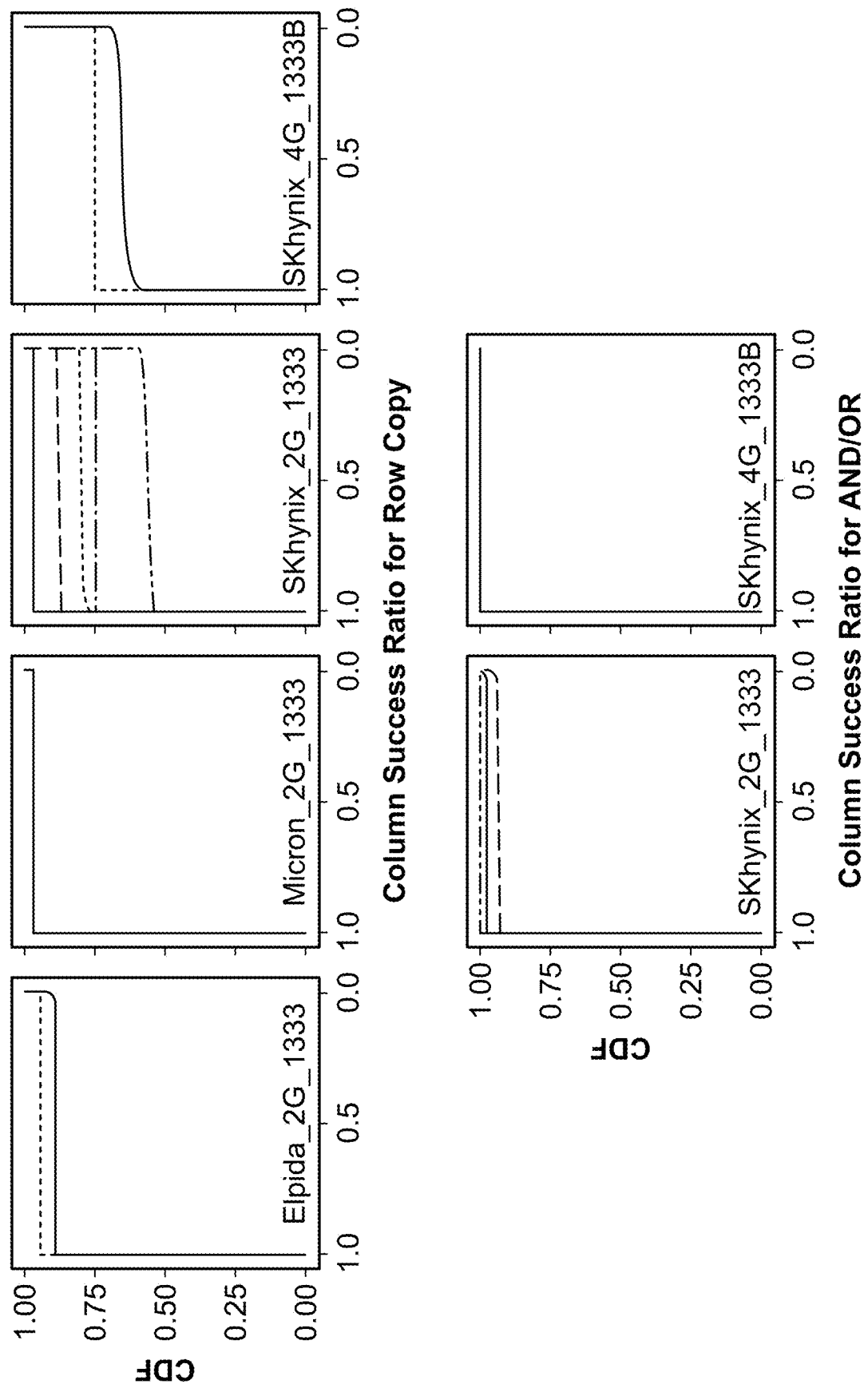
FIG. 12 depicts a cumulative distribution function (CDF) showing the stability of the row copy and AND/OR operation for each memory group according to an embodiment of the present invention.

The row copy reliability benchmark was run only on groups that exhibit the ability of performing perfect row copy in at least one sub-array—Micron_2G_1333, Elpida_2G_1333, SKhynix_2G_1333, SKhynix_4G_1333B. For each module, the timing intervals were fixed to the pair that generated the best row copy result in the previous exploratory test. For a single bank from each module, the row copy reliability test was performed 1000 times, in which different randomly-generated data are copied back and forth all over 32K rows. Subsequently, a success ratio was produced for each column of a sub-array based on the times that it contained the correct result. FIG. 12 presents the Cumulative Distribution Function (CDF) of success ratio for the different DRAM groups, with each module in the group represented by a different line. The data for row copy is shown in the four leftmost sub-plots of FIG. 12. The sharp rise at the beginning of the CDF indicates that in all modules, at least half of the columns can reliably perform the row copy operation. Across different modules, 53.9% to 96.9% of the columns present 100% success ratio when performing the row copy operation. The flat horizontal line in the CDF indicates that most of the remaining columns always fail to perform the row copy operation (having a zero-success ratio). This result validates the strategy of producing an error table of "bad" columns to the software framework and completely avoid utilizing the offending columns.

A similar test was performed for the logical AND/OR operations. Targeting eight modules from groups SKhynix_2G_1333 and SKhynix_4G_1333B, for all sub-arrays in eight banks from each module, the operations were performed 10000 times, half AND and half OR, on the first three rows. Again, the operands used in the test are randomly generated. Subsequently, a success ratio was produced for each column of a sub-array. In the two rightmost sub-plots of FIG. 12, a sharp rise is seen in the start of those CDFs. Among the tested modules, 92.5% to 99.98% percent of columns exhibit 100% success ratio when performing the logical AND/OR operations.

Effect of Supply Voltage and Temperature:

Having as a reference the robustness evaluation at nominal conditions, the evaluation was expanded to supply voltages from 1.2V to 1.6V, with a step of 0.05V, and chip temperatures from 30° C. to 80° C., with a step of 5° C. The range of the evaluation was dictated by practical considerations. For supply voltage, the upper limit is imposed by the infrastructure, while the lower limit is imposed by the fact that most of the DDR3 modules tested could not be read/written with a supply voltage below 1.2V. For temperature, it was chosen start from room temperature and study up to 80° C. on the DRAM package, as temperatures outside this range are not common for commodity applications. Timing intervals are fixed to the optimal ones identified on the exploratory scan (see FIGS. 11(a)-(b)). Similar to the initial robustness test, under each environment setup, 10 row copy scans and 100 AND/OR scans were run, and the success ratio for each column was collected.

Figure 13:
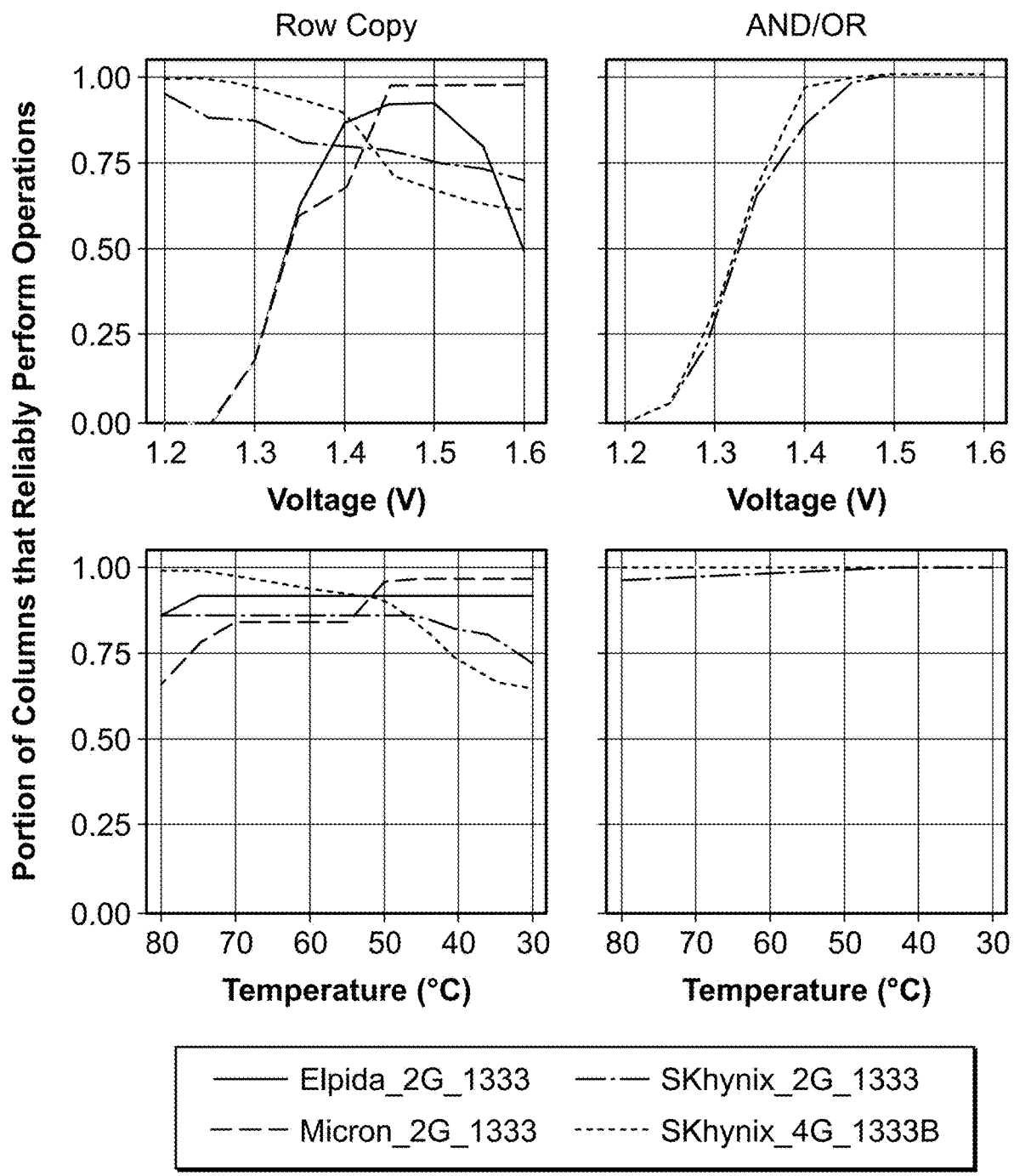
FIG. 13 depicts a graph with the portion of columns that could reliably perform operations with varied supply voltage and temperature for different DRAM groups according to an embodiment of the present invention.

The top part of FIG. 13 presents how the amount of the columns that perform row copy and AND/OR operations reliably (100% success ratio) changes as a function of supply voltage for different memory groups. Each line represents the average result among the modules in that group.

In the top part of FIG. 12 it was observed that: for row copy, Micron modules prefer higher voltage, SK hynix modules prefer lower voltages, and for Elpida modules, the reliability is maximized at nominal supply voltage. Though the effect of supply voltage on the reliability differs across vendors, the pattern stays the same for modules in the same group, thus the behavior is affected by implementation choices.

Reducing supply voltage increases propagation delay making the circuit "slower". Thus, assuming a fixed frequency, the time period of one cycle at nominal supply voltage is equivalent to more than one cycle at 1.2V supply voltage; that is, the signal needs more time to fully propagate due to increased propagation delay. Therefore, if we alter the supply voltage is altered, there could be a slightly changed "effective" timing interval. The closer this "effective" timing interval is to the "real optimal" timing interval, the higher the success ratio goes. Because of different implementation details, the "real optimal" timing intervals vary among the modules from different manufacturers. That is the reason why the effect of supply voltage on reliability differs across manufacturers. For AND/OR operations, as the voltage drops, the circuit gets so slow that the first ACTIVATE cannot even open the first row yet. Thus, the success ratio drops as well.

Figures 14, 15:
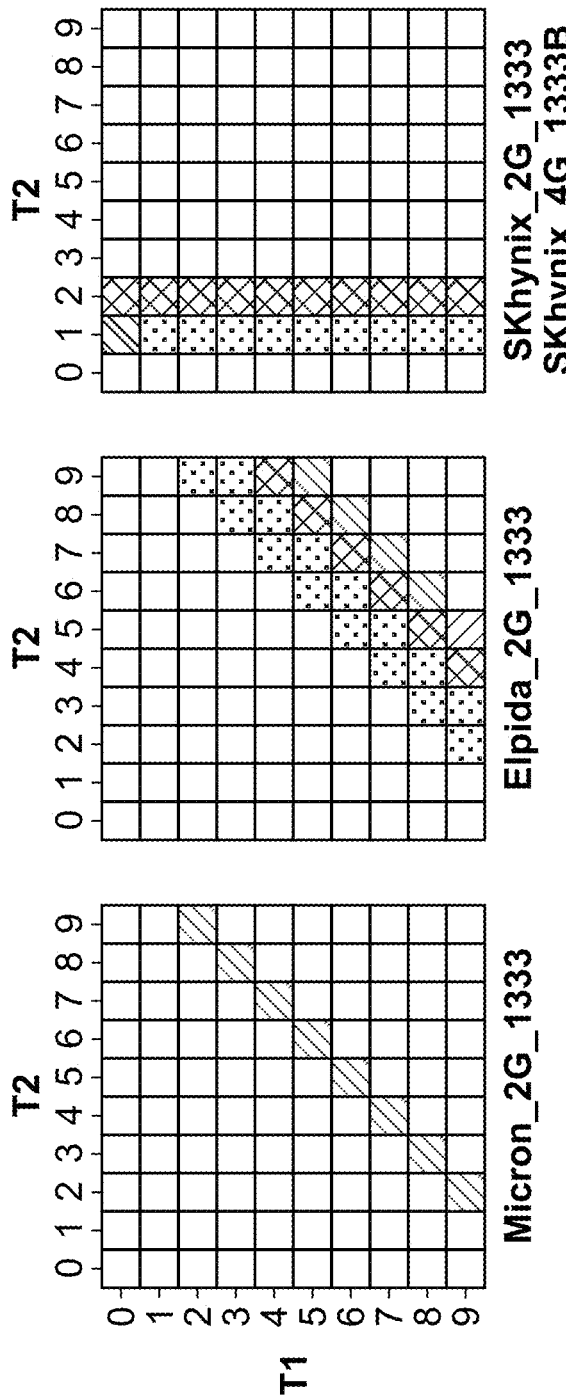
FIG. 14 depicts a heatmap of successfully performed operations at a supply voltage of 1.2 V only with DRAM groups that reliably performed operations at nominal voltage according to an embodiment of the present invention.
FIG. 15 depicts a table of cycles of memory commands for 1-bit operation using SK Hynix modules according to an embodiment of the present invention.

To verify this timing assumption, a second timing interval scan was conducted using a supply voltage of 1.2V. As can be seen in FIG. 14, the optimal timing intervals are larger than the previous ones, which proves that the lower voltage makes the circuit slower, and more cycles are needed to achieve the same effect.

In regard to the effect of temperature on robustness (see the bottom part of FIG. 13), it is observed that the effect of increasing the temperature is similar to lowering the supply voltage. Essentially, the sub-plots for temperature present a "zoom in" on the top part of FIG. 13. This is because at higher temperature (inside the range), the circuit's carrier mobility decreases, thus increasing the propagation delay and making the circuit slower. From the perspective of timing, it has the same effect as a lower supply voltage. Based on the above results, it is concluded that the system keeps working within a reasonable variation of supply voltage (±0.1 V) and temperature. Furthermore, it is determined that the system designer should take into consideration the operational temperature of the system when selecting memory vendors.

Overall, it is expected that computation enabled DRAMs based on embodiments of the disclosed invention will require a production step that "bins" modules based on their ability to perform in-memory computations, in what voltage and temperature ranges, and with what level of reliability, similar to a process for CPUs. It is to be noted this binning step would not be complicated and would be similar to be the scanning process described earlier.

CONCLUSION

The back-of-the envelope quantitative numbers, to be described below, are based on an extension of the software framework that implements a series of vector functions: element-wise row copy, AND, OR, multi-input majority, XOR, SHIFT, ADD, SUBTRACT, MULTIPLY, and DIVIDE operations, as nonlimiting examples. All extended functionality was constructed using only the three basic in-memory operations evaluated earlier. The added operations follow the convention of bit-serial computing, allowing seamless configuration of the operation's bit-width. The table in FIG. 15 presents the number of cycles spent on the memory command bus for the computation of a single bit for each of the vector function. The memory command cycles spent on N-bit operations can be calculated by scaling N× the data in FIG. 15.

The computational throughput and performance of embodiments of the disclosed invention is significantly affected by the characteristics of the targeted computation, such as, the level of parallelism and the scale of computation. Compared against the cost of performing a single scalar operation in a modern CPU, embodiments of the disclosed invention will not provide any benefit, as a single ADD operation accounts for over a thousand cycles and the DRAM command frequency is lower than that of a processor core. Furthermore, if the data being computed exhibit high locality, the immense bandwidth out of on-chip SRAMs and Register Files (RF) can significantly increase peak performance for CPUs. To achieve high computational throughput, embodiments of the disclosed invention exploit the fact that its computational overhead does not change when moving from scalar to vector operations, up to vectors of 64K elements (for a single module), due to the constant cost of performing row-wise computation across all eight chips of the DRAM. For example, for row copy, the disclosed technique requires 18 memory cycles with a peak bandwidth of 182 GB/s using a single DDR3 module. On embodiments disclosed herein, 8-bit AND/OR operations take 1376 cycles providing a peak throughput of 19GOPS, and 8-bit ADD operation takes 10656 cycles for a peak throughput of 2.46GOPS. This baseline performance can be enhanced by interleaving the issuing of commands across different banks. Moreover, further parallelism can be extracted by building a board with multiple DRAM slots, where a single MC will control all DRAM modules simultaneously through broadcasts in the shared memory command bus. Thus, embodiments of the disclosed invention's ideal targets are massive computations that exhibits a large amount of main memory accesses.

The main overhead of embodiments disclosed herein is the duplicated computation and storage required by the disclosed framework. This inefficiency can be addressed at the compiler level. As more complex computation is offloaded to embodiments disclosed herein, the compiler which is responsible for translating high-level code to a sequence of DRAM commands can perform optimization to reduce the number of commands, by minimizing both the nominal and complementary (negated version) intermediate computations. Such optimization has already been manually performed in the implementation of the ADD operation in our software framework.

As computation in CPU and DRAM is decoupled, the overall computational capability of the system is increased. Furthermore, as computation is moved from the CPU to the main memory the interconnect's utilization is reduced. This can lead to reduced latency and runtime.

The main benefit of embodiments of the disclosed invention is its high energy efficiency, as it eliminates the high energy overhead of transferring data between CPU and main memory. If data is fetched from memory to the CPU, computed on, and stored back in memory, embodiments disclosed herein are 347× more energy efficient than using a vector unit for row copy, and 48× and 9.3× for 8-bit AND/OR and ADD, respectively. The baseline is the energy used to read the operands from DRAM and write the result into DRAM, as memory access takes the main portion of the total energy consumption in the target scenario. It is assumed that the data and its compliment is resident in the DRAM at the beginning of the computation.

Embodiments generally disclosed herein can be implemented in multiple ways. First, it can be implemented as a modification to a traditional hardware memory controller. This modification would add the ability to be instructed to perform computation operations and copy operations against the DRAM or memory. Alternatively, the memory controller could be modified to work with software to perform operations with the unique timing described earlier to perform computation and copy operations against DRAM and memory. It is envisioned that this could be used as a new accelerator architecture, like a GPU, or could be implemented as part of memory controllers on every computer system built and shipped. This technique could also be used as part of a large-scale supercomputer with fields of DRAM all controlled by one specially built memory controller.

As such, embodiments generally disclosed herein illustrate the feasibility of performing in-memory operations in unmodified DRAM. Utilizing a customized memory controller, the timing of standard DRAM memory transactions was changed, operating outside of specification, to perform massively parallel logical AND, logical OR, and row copy operations. A technique was created to compute arbitrary computations based on the three available, non-inverting, in-memory operations. The technique was incorporated in a software framework to run massively parallel bit-serial computations and was demonstrated working in a real system. Finally, the capabilities and robustness of the in-memory compute operations across DDR3 DRAM modules from all major DRAM vendors, and under different supply voltages and temperatures were characterized.

Embodiments generally disclosed herein may have a large impact on the computing industry with minimal hardware design changes. Currently, DRAM is solely used to store data. But that unmodified DRAM can be used to perform computations, as-is, or with nominal modifications by DRAM vendors, means that with a small update to the DRAM controller, all new computers can perform massively parallel computations without needing to have data transmitted to or from the memory bus or memory hierarchy.

It is understood that the above-described embodiments are only illustrative of the application of the principles of the present invention. The present invention may be embodied in other specific forms without departing from its spirit or essential characteristics. All changes that come within the meaning and range of equivalency of the claims are to be embraced within their scope. Thus, while the present invention has been fully described above with particularity and detail in connection with what is presently deemed to be the most practical and preferred embodiment of the invention, it will be apparent to those of ordinary skill in the art that numerous modifications may be made without departing from the principles and concepts of the invention as set forth in the claims.

What is claimed is:

1. An in-memory computation system, comprising:
a dynamic random access memory (DRAM) module; and
a memory controller configured to violate a timing specification for the DRAM module and activate multiple rows of the DRAM module in rapid succession to enable bit-line charge sharing.

2. The system of claim 1, wherein the DRAM module comprises a hierarchical system organization of channels, ranks, banks, and rows and columns.

3. The system of claim 2, wherein each bank comprises a plurality of sub-arrays containing a plurality of rows.

4. The system of claim 3, wherein each sub-array comprises a plurality of bit-lines configured to connect all cells in one bit of column to a sense amplifier of a local row buffer.

5. The system of claim 1, wherein the memory controller is coupled to at least one of a processor and input/output device.

6. The system of claim 1, wherein the memory controller is configured to send PRECHARGE, ACTIVATE, READ, and WRITE commands to the DRAM module.

7. The system of claim 1, wherein the DRAM module is configured to perform at least one of row copy, logical AND, logical OR, and multi-input majority operations based on commands received from the memory controller.

8. The system of claim 7, wherein the DRAM module is configured to perform at least one of logical XOR, logical SHIFT, subtract, multiply, divide, and arithmetic ADD operations using the row copy, logical AND, logical OR, and multi-input majority operations.

9. The system of claim 7, wherein for performing row copy, the memory controller is configured to:
send a first ACTIVATE command to a first row of the DRAM module;
send a PRECHARGE command to the DRAM module; and
send a second ACTIVATE command to a second row of the DRAM module;
a timing interval between the PRECHARGE command and the second ACTIVATE command being shorter than a minimum time required for a bit-line voltage to reach its precharge value but being long enough so that a third row is not activated.

10. The system of claim 7, wherein for performing at least one of logical AND and logical OR, the memory controller is configured to:
send a first ACTIVATE command to a first row of the DRAM module;
send a PRECHARGE command to the DRAM module; and
send a second ACTIVATE command to a second row of the DRAM module;
a first timing interval between the first ACTIVATE command and the PRECHARGE command and a second timing interval between the PRECHARGE command and the second ACTIVATE command both being set to a minimum value such that no idle cycles are between the first ACTIVATE command, PRECHARGE command, and second ACTIVATE command.

11. The system of claim 1, wherein the memory controller is configured to:
scan the DRAM module for rows and columns that fail to perform an operation; and
compile an error table of the rows and columns that fail to perform an operation;
the DRAM module to skip the rows and columns in the error table when receiving commands from the memory controller.

12. A method for performing computation in a memory system, the memory system including a dynamic random access memory (DRAM) module and a memory controller, the method comprising:
violating via the memory controller a timing specification for the DRAM module; and
activating via the memory controller multiple rows of the DRAM module in rapid succession to enable bit-line charge sharing.

13. The method of claim 12, further comprising sending via the memory controller PRECHARGE, ACTIVATE, READ, and WRITE commands to the DRAM module.

14. The method of claim 12, further comprising performing via the DRAM module at least one of row copy, logical AND, logical OR, and multi-input majority operations based on commands received from the memory controller.

15. The method of claim 14, further comprising performing via the DRAM at least one of logical XOR, logical SHIFT, subtract, multiply, divide, and arithmetic ADD operations using the row copy, logical AND, logical OR, and multi-input majority operations.

16. The method of claim 14, wherein performing row copy comprises sending commands from the memory controller to the DRAM module, the commands comprising:
sending a first ACTIVATE command to a first row of the DRAM module;
sending a PRECHARGE command to the DRAM module; and
sending a second ACTIVATE command to a second row of the DRAM module;
a timing interval between the PRECHARGE command and the second ACTIVATE command being shorter than a minimum time required for a bit-line voltage to reach its precharge value but being long enough so that a third row is not activated.

17. The method of claim 14, wherein performing at least one of logical AND and logical OR comprises sending commands from the memory controller to the DRAM module, the commands comprising:
sending a first ACTIVATE command to a first row of the DRAM module;
sending a PRECHARGE command to the DRAM module; and
sending a second ACTIVATE command to a second row of the DRAM module;
a first timing interval between the first ACTIVATE command and the PRECHARGE command and a second timing interval between the PRECHARGE command and the second ACTIVATE command both being set to a minimum value such that no idle cycles are between the first ACTIVATE command, PRECHARGE command, and second ACTIVATE command.

18. The system of claim 12, further comprising via the memory controller:
scanning the DRAM module for rows and columns that fail to perform an operation; and
compiling an error table of the rows and columns that fail to perform an operation;
the DRAM module to skip the rows and columns in the error table when receiving commands from the memory controller.

19. An in-memory computation system, comprising:
a memory module; and
a memory controller configured to violate a timing specification for the memory module and activate multiple rows of the memory module in rapid succession to enable bit-line charge sharing.

20. The system of claim 19, wherein the memory module comprises a hierarchical system organization of channels, ranks, banks, and rows and columns.

21. The system of claim 20, wherein each bank comprises a plurality of sub-arrays containing a plurality of rows.

22. The system of claim 21, wherein each sub-array comprises a plurality of bit-lines configured to connect all cells in one bit of column to a sense amplifier of a local row buffer.

23. The system of claim 19, wherein the memory controller is coupled to at least one of a processor and input/output device.

24. The system of claim 19, wherein the memory controller is configured to send PRECHARGE, ACTIVATE, READ, and WRITE commands to the memory module.

25. The system of claim 19, wherein the memory module is configured to perform at least one of row copy, logical AND, logical OR, and multi-input majority operations based on commands received from the memory controller.

26. The system of claim 25, wherein the memory module is configured to perform at least one of logical XOR, logical SHIFT, subtract, multiply, divide, and arithmetic ADD operations using the row copy, logical AND, logical OR, and multi-input majority operations.

27. The system of claim 25, wherein for performing row copy, the memory controller is configured to:
send a first ACTIVATE command to a first row of the memory module;
send a PRECHARGE command to the memory module; and
send a second ACTIVATE command to a second row of the memory module;
a timing interval between the PRECHARGE command and the second ACTIVATE command being shorter than a minimum time required for a bit-line voltage to reach its precharge value but being long enough so that a third row is not activated.

28. The system of claim 25, wherein for performing at least one of logical AND and logical OR, the memory controller is configured to:
send a first ACTIVATE command to a first row of the memory module;
send a PRECHARGE command to the memory module; and
send a second ACTIVATE command to a second row of the memory module;
a first timing interval between the first ACTIVATE command and the PRECHARGE command and a second timing interval between the PRECHARGE command and the second ACTIVATE command both being set to a minimum value such that no idle cycles are between the first ACTIVATE command, PRECHARGE command, and second ACTIVATE command.

29. The system of claim 19, wherein the memory controller is configured to:
scan the memory module for rows and columns that fail to perform an operation; and
compile an error table of the rows and columns that fail to perform an operation;
the memory module to skip the rows and columns in the error table when receiving commands from the memory controller.

* * * * *